(12) United States Patent
Han et al.

(10) Patent No.: US 11,581,326 B2
(45) Date of Patent: Feb. 14, 2023

(54) THREE-DIMENSIONAL SEMICONDUCTOR MEMORY DEVICE

(71) Applicant: SAMSUNG ELECTRONICS CO., LTD., Suwon-si (KR)

(72) Inventors: Tae-Jong Han, Seoul (KR); Jaekang Koh, Seongnam-si (KR); Munjun Kim, Suwon-si (KR); Su Jong Kim, Suwon-si (KR); Seung-Heon Lee, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 217 days.

(21) Appl. No.: 16/913,705

(22) Filed: Jun. 26, 2020

(65) Prior Publication Data
US 2021/0167080 A1 Jun. 3, 2021

(30) Foreign Application Priority Data
Nov. 28, 2019 (KR) ........................ 10-2019-0155598

(51) Int. Cl.
*H01L 27/11573* (2017.01)
*H01L 23/528* (2006.01)
*H01L 27/11529* (2017.01)
*H01L 27/11556* (2017.01)
(Continued)

(52) U.S. Cl.
CPC ...... *H01L 27/11573* (2013.01); *H01L 23/528* (2013.01); *H01L 27/1158* (2013.01); *H01L 27/11529* (2013.01); *H01L 27/11556* (2013.01); *H01L 27/11575* (2013.01)

(58) Field of Classification Search
CPC ......... H01L 27/11575; H01L 27/11512; H01L 27/11548; H01L 27/11595; H01L 27/115414; H01L 27/11582; H01L 27/11556; H01L 27/11597
See application file for complete search history.

(56) References Cited

U.S. PATENT DOCUMENTS

| 6,566,188 B2 | 5/2003 | Kim et al. |
| 6,790,729 B1 | 9/2004 | Woo |
| 7,221,597 B2 | 5/2007 | Forbes |

(Continued)

FOREIGN PATENT DOCUMENTS

| JP | 3348553 B2 | 9/2002 |
| KR | 10-0380149 B1 | 4/2003 |

(Continued)

*Primary Examiner* — Amar Movva
(74) *Attorney, Agent, or Firm* — Myers Bigel, P.A.

(57) ABSTRACT

A three-dimensional semiconductor memory device is disclosed. The device may include a substrate including a cell array region and a connection region provided at an end portion of the cell array region, an electrode structure extending from the cell array region to the connection region, the electrode structure including electrodes sequentially stacked on the substrate, an upper insulating layer provided on the electrode structure, a first horizontal insulating layer provided in the upper insulating layer and extending along the electrodes, and first contact plugs provided on the connection region to penetrate the upper insulating layer and the first horizontal insulating layer. The first horizontal insulating layer may include a material having a better etch-resistive property than the upper insulating layer.

19 Claims, 17 Drawing Sheets

(51) Int. Cl.
  *H01L 27/1158* (2017.01)
  *H01L 27/11575* (2017.01)

(56) References Cited

U.S. PATENT DOCUMENTS

| | | |
|---|---|---|
| 7,268,040 B2 | 9/2007 | Shim |
| 7,473,602 B2 | 1/2009 | Jung |
| 7,608,507 B2 | 10/2009 | Lee et al. |
| 7,727,839 B2 | 6/2010 | Om et al. |
| 7,738,298 B2 | 6/2010 | Chae et al. |
| 7,750,384 B2 | 7/2010 | Lee |
| 8,048,747 B1 | 11/2011 | Chen et al. |
| 8,263,473 B2 | 9/2012 | Lee |
| 8,580,645 B2 | 11/2013 | Prall et al. |
| 9,224,475 B2 | 12/2015 | Sel et al. |
| 9,425,047 B1 | 8/2016 | Tobioka |
| 2008/0061355 A1 | 3/2008 | Choi |
| 2008/0061358 A1 | 3/2008 | Choi |
| 2011/0294276 A1 | 12/2011 | Kuroki |
| 2014/0151774 A1 | 6/2014 | Rhie |
| 2016/0225616 A1* | 8/2016 | Li ............... H01L 21/02274 |
| 2017/0148677 A1* | 5/2017 | Shin ............... H01L 27/1157 |
| 2019/0221579 A1 | 7/2019 | Kim et al. |
| 2019/0326166 A1 | 10/2019 | Nam et al. |
| 2019/0333923 A1 | 10/2019 | Kim et al. |

FOREIGN PATENT DOCUMENTS

| | | |
|---|---|---|
| KR | 10-2008-0072255 A | 8/2008 |
| KR | 10-2009-0043330 A | 5/2009 |

\* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2019-0155598, filed on Nov. 28, 2019, in the Korean Intellectual Property Office, the entire contents of which are hereby incorporated by reference.

BACKGROUND OF THE INVENTION

The present disclosure relates to a three-dimensional semiconductor memory device, and in particular, to a three-dimensional semiconductor memory device with improved electric characteristics.

Higher integration of semiconductor devices may be required to satisfy consumer demands for superior performance and inexpensive prices. In the case of semiconductor devices, since their integration is an important factor in determining product prices, increased integration may be required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness may set a practical limitation on increasing integration for two-dimensional or planar semiconductor devices. Thus, three-dimensional semiconductor memory devices including three-dimensionally arranged memory cells have recently been proposed.

SUMMARY

An embodiment of the inventive concept provides a three-dimensional semiconductor memory device with improved electric characteristics.

According to an embodiment of the inventive concept, a three-dimensional semiconductor memory device may include a substrate including a cell array region and a connection region provided at an end portion of the cell array region, an electrode structure extending from the cell array region to the connection region, the electrode structure including electrodes sequentially stacked on the substrate, an upper insulating layer on the electrode structure, a first horizontal insulating layer in the upper insulating layer and extending along the electrodes, and first contact plugs in the connection region that penetrate the upper insulating layer and the first horizontal insulating layer. The first horizontal insulating layer may include a material having a higher etch resistance than the upper insulating layer.

According to an embodiment of the inventive concept, a three-dimensional semiconductor memory device may include a substrate including a cell array region and a connection region at an end portion of the cell array region, an electrode structure extending from the cell array region to the connection region, the electrode structure including electrodes, which are sequentially stacked on the substrate, interlayer insulating layers between the electrodes, an upper insulating layer on the electrode structure, a first horizontal insulating layer in an uppermost interlayer insulating layer of the interlayer insulating layers and extending along the electrodes, a second horizontal insulating layer in the upper insulating layer and extending along the electrodes, a vertical structure penetrating the electrode structure and the first horizontal insulating layer, and first contact plugs penetrating the upper insulating layer and the first and second horizontal insulating layers. The first and second horizontal insulating layers may be vertically spaced apart from each other. A concentration of a nonmetallic element, except for oxygen, may be higher in the second horizontal insulating layer than in the upper insulating layer.

According to an embodiment of the inventive concept, a three-dimensional semiconductor memory device may include a substrate including a cell array region, a peripheral circuit region including peripheral circuits, and a connection region between the cell array region and the peripheral circuit region, an electrode structure extending from the cell array region to the connection region, the electrode structure including electrodes, which are vertically stacked on the substrate, interlayer insulating layers interposed between the electrodes, an upper insulating layer on the electrode structure, a horizontal insulating layer in the upper insulating layer and extending along the electrodes, a vertical structure penetrating the electrode structure, the vertical structure including a data storage pattern, a vertical semiconductor pattern surrounded by the data storage pattern, a conductive pad connected to a top portion of the vertical semiconductor pattern, a bit line provided on the upper insulating layer and electrically connected to the conductive pad of the vertical structure, first contact plugs, each of which is on the connection region to penetrate the upper insulating layer, the horizontal insulating layer, and one of the interlayer insulating layers and is connected to a corresponding one of the electrodes, second contact plugs on the peripheral circuit region to penetrate the upper insulating layer and the horizontal insulating layer and connected to the peripheral circuits, and conductive lines connected to the first and second contact plugs, respectively. A concentration of a nonmetallic element, except for oxygen, may be higher in the horizontal insulating layer than in the upper insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
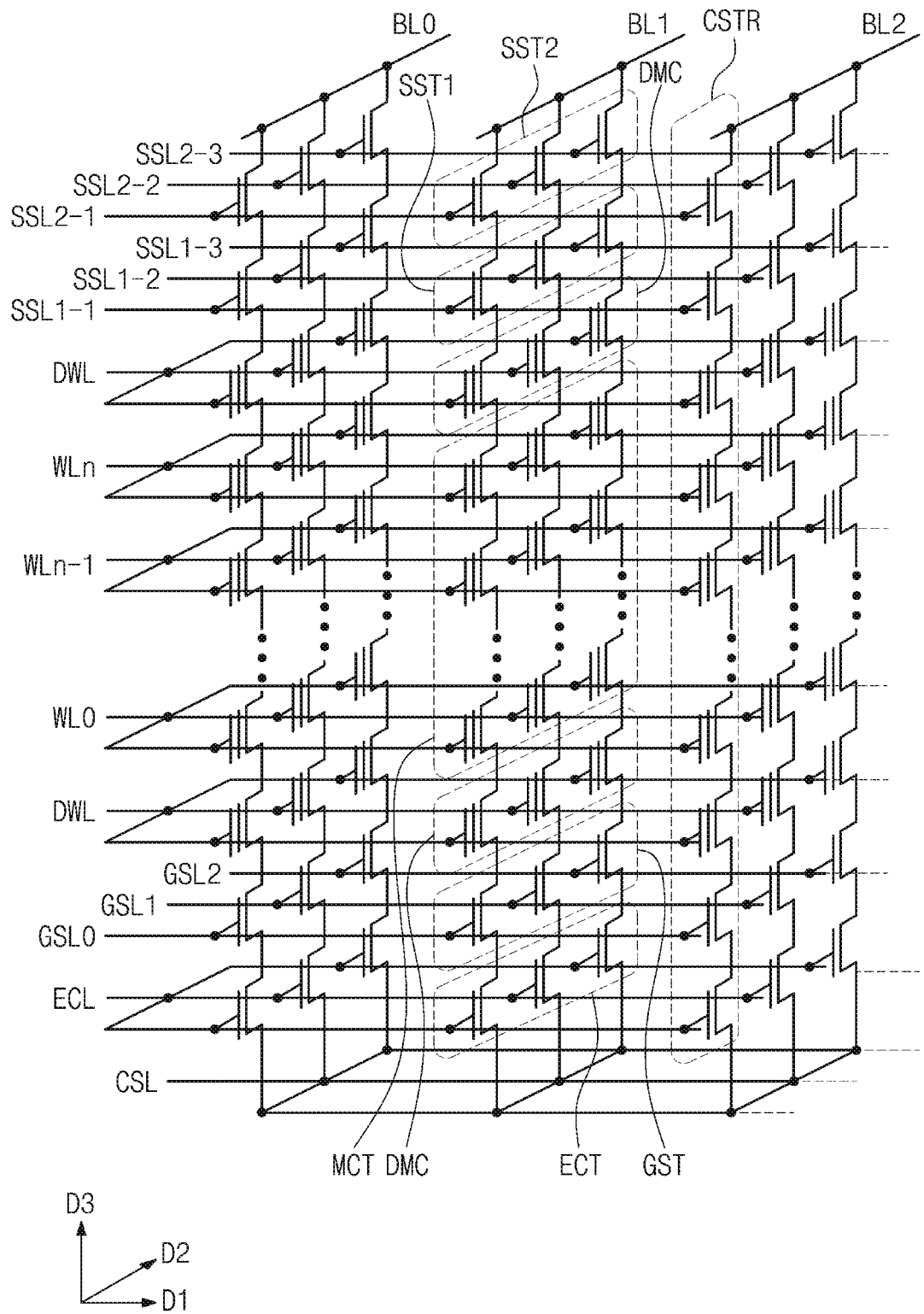
FIG. 1 is a circuit diagram schematically illustrating a cell array of a three-dimensional semiconductor memory device according to an embodiment of the inventive concept.

FIG. 1 is a circuit diagram schematically illustrating a cell array of a three-dimensional semiconductor memory device according to an embodiment of the inventive concept.

Referring to FIG. 1, the cell array of the three-dimensional semiconductor memory device may include a common source line CSL, a plurality of bit lines BL0-BL2, and a plurality of cell strings CSTR, which are provided between the common source line CSL and the bit lines BL0-BL2.

The cell strings CSTR may be two-dimensionally arranged in a first direction D1 and a second direction D2, which are not parallel to each other. In an embodiment, the second direction D2 may be perpendicular to the first direction D1. Each of the cell strings CSTR may be extended in a third direction D3. In an embodiment, the third direction D3 may be perpendicular to both of the first and second directions D1 and D2. The bit lines BL0-BL2 may be spaced apart from each other in the first direction D1. Each of the bit lines BL0-BL2 may be extended in the second direction D2.

A plurality of the cell strings CSTR may be connected in parallel to each of the bit lines BL0-BL2. The cell strings CSTR may be connected in common to the common source line CSL. That is, a plurality of the cell strings CSTR may be provided between the bit lines BL0-BL2 and the single common source line CSL. In an embodiment, the common source line CSL may be provided in plural. The common source lines CSL may be two-dimensionally arranged. The common source lines CSL may be applied with the same voltage or may have electric states that are independently controlled.

In an embodiment, each of the cell strings CSTR may include first and second string selection transistors SST1 and SST2, which are connected in series to each other, memory cell transistors MCT, which are connected in series to each other, a ground selection transistor GST, and an erase control transistor ECT. Each of the memory cell transistors MCT may include a data storage element.

As an example, each of the cell strings CSTR may include the first and second string selection transistors SST1 and SST2, which are connected in series, and the second string selection transistor SST2 may be coupled to one of the bit lines BL0-BL2. As another example, each of the cell strings CSTR may include one string selection transistor. As other example, in each of the cell strings CSTR, the ground selection transistor GST may be composed of a plurality of metal-oxide-semiconductor (MOS) transistors, which are connected in series, similar to the first and second string selection transistors SST1 and SST2.

Each of the cell strings CSTR may include a plurality of the memory cell transistors MCT, which are located at different heights from the common source lines CSL. The memory cell transistors MCT may be connected in series, between the first string selection transistor SST1 and the ground selection transistor GST. The erase control transistor ECT may be provided between and connected to the ground selection transistor GST and the common source lines CSL. In addition, each of the cell strings CSTR may include dummy cell transistors DMC, which are provided between and connected to the first string selection transistor SST1 and the uppermost one of the memory cell transistors MCT and are provided between and connected to the ground selection transistor GST and the lowermost one of the memory cell transistors MCT and are connected to them.

In an embodiment, the first string selection transistor SST1 may be controlled by one of first string selection lines SSL1-1, SSL1-2, and SSL1-3, and the second string selection transistor SST2 may be controlled by one of second string selection lines SSL2-1, SSL2-2, and SSL2-3. The memory cell transistors MCT may be controlled by a plurality of word lines WL0-WLn, respectively, and the dummy cell transistors DMC may be controlled by a dummy word line DWL. The ground selection transistor GST may be controlled by one of the ground selection lines GSL0, GSL1, and GSL2, and the erase control transistor ECT may be controlled by an erase control line ECL. In an embodiment, the erase control transistor ECT may be provided in plural. The common source lines CSL may be connected in common to sources of the erase control transistors ECT.

Gate electrodes of the memory cell transistors MCT, which are located at substantially the same height from the common source lines CSL, may be connected in common to one of the word lines WL0-WLn and may be in an equipotential state. Alternatively, even when the gate electrodes of the memory cell transistors MCT are located at substantially the same height from the common source lines CSL, the gate electrodes constituting different rows or columns may be independently controlled.

The ground selection lines GSL0-GSL2, the first string selection lines SSL1-1, SSL1-2, and SSL1-3, and the second string selection lines SSL2-1, SSL2-2, and SSL2-3 may be extended in the first direction D1 and may be spaced apart from each other in the second direction D2. The ground selection lines GSL0-GSL2, the first string selection lines SSL1-1, SSL1-2, and SSL1-3, and the second string selection lines SSL2-1, SSL2-2, and SSL2-3, which are located at substantially the same height from the common source lines CSL, may be electrically separated from each other. In addition, the erase control transistors ECT, which are included in different ones of the cell strings CSTR, may be commonly controlled by the erase control line ECL. During an erase operation of the memory cell array, the erase control transistors ECT may cause a gate induced drain leakage (GIDL). In an embodiment, during the erase operation of the memory cell array, an erase voltage may be applied to the bit lines BL0-BL2 and/or the common source lines CSL, and in this case, the gate-induced leakage current may be produced at the string selection transistors SST1 and SST2 and/or the erase control transistor ECT.

Figure 2A:
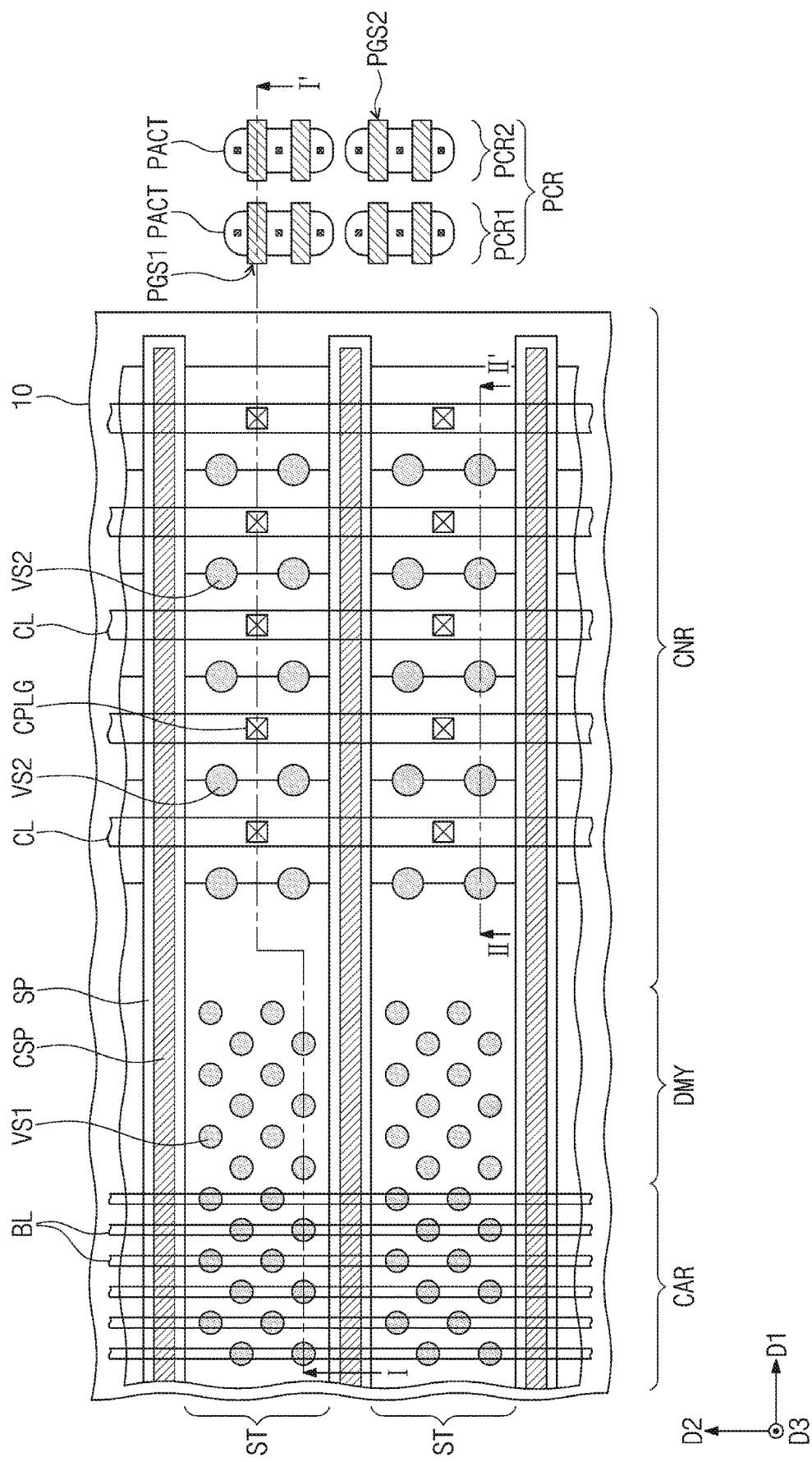
FIG. 2A is a plan view illustrating a three-dimensional semiconductor memory device according to an embodiment of the inventive concept.
Figure 2B:
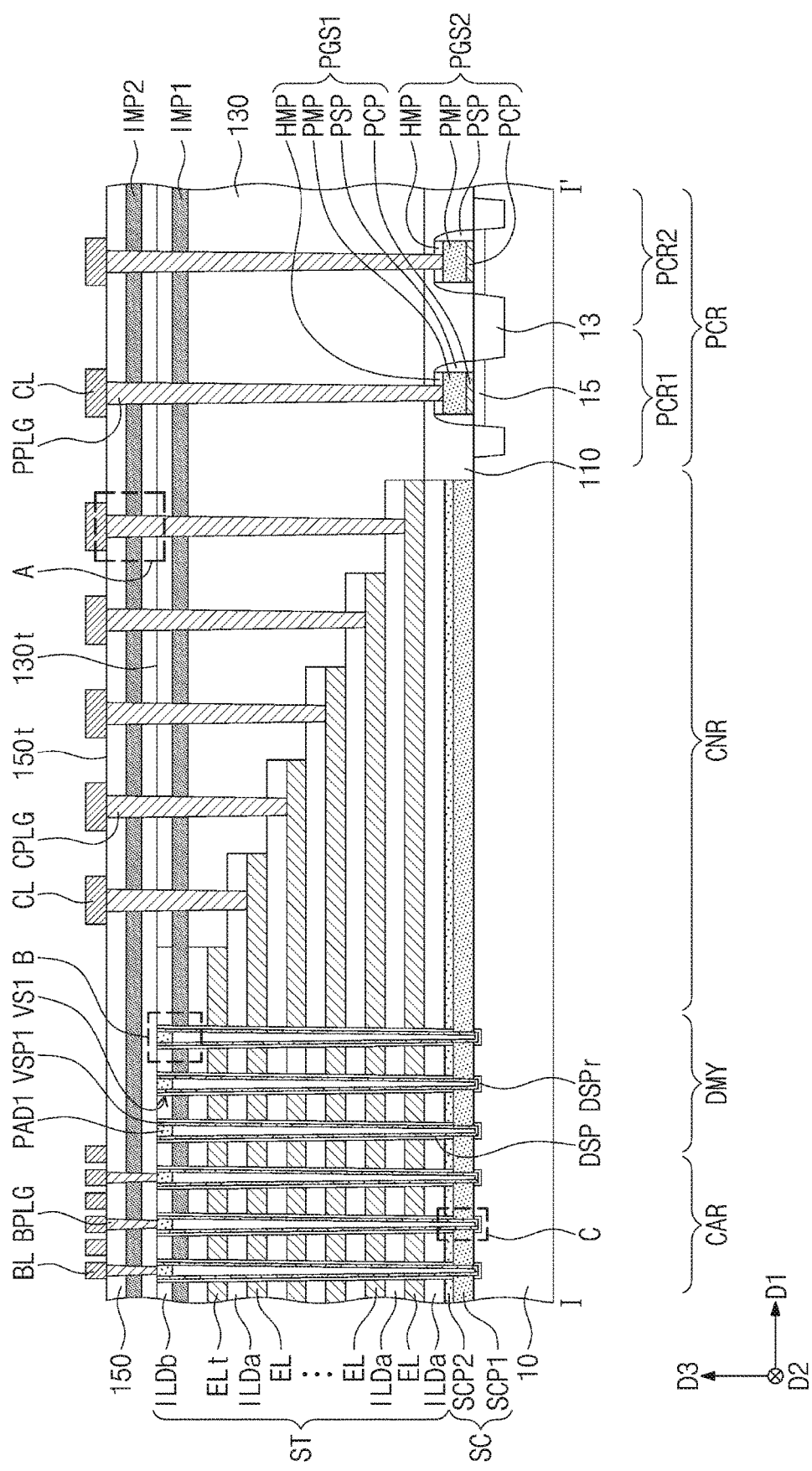
FIGS. 2B, 8A, and 9A are sectional views illustrating a three-dimensional semiconductor memory device according to an embodiment of the inventive concept, taken along a line I-I' of FIG. 2A.
Figure 2C:
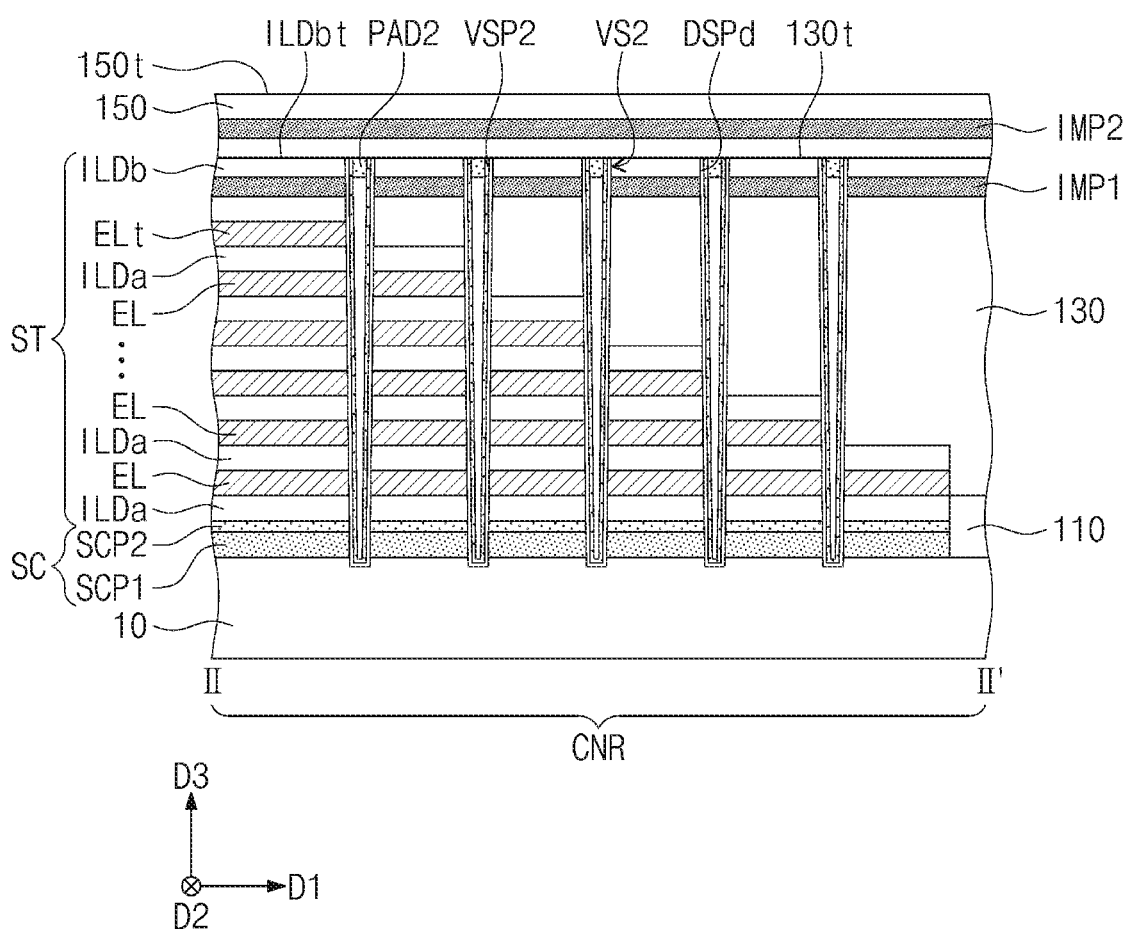
FIGS. 2C, 8B, and 9B are sectional views illustrating a three-dimensional semiconductor memory device according to an embodiment of the inventive concept, taken along a line II-IT of FIG. 2A.

FIG. 2A is a plan view illustrating a three-dimensional semiconductor memory device according to an embodiment of the inventive concept. FIGS. 2B and 2C are sectional views illustrating a three-dimensional semiconductor memory device according to an embodiment of the inventive concept, taken along lines I-I' and II-II' of FIG. 2A, respectively.

Referring to FIGS. 2A, 2B, and 2C, a substrate 10 may include a cell array region CAR, a connection region CNR, a dummy region DMY, and a peripheral circuit region PCR. The connection region CNR may be positioned between the cell array region CAR and the peripheral circuit region PCR. The dummy region DMY may be adjacent to the cell array region CAR in the first direction D1 parallel to a top surface of the substrate 10. The dummy region DMY may be positioned between the cell array region CAR and the connection region CNR. The peripheral circuit region PCR may be adjacent to the connection region CNR in the first direction D1. The peripheral circuit region PCR may include a first peripheral circuit region PCR1 and a second peripheral circuit region PCR2, and in an embodiment, the first peripheral circuit region PCR1 may be closer to the cell array region CAR than the second peripheral circuit region PCR2. However, the inventive concept is not limited to this example, and in an embodiment, the substrate 10 may further include a boundary region between the peripheral circuit region PCR and the connection region CNR.

The substrate 10 may be a silicon substrate, a silicon-germanium substrate, a germanium substrate, or a single-crystalline epitaxial layer grown on a single-crystalline silicon substrate. A device isolation layer 13 may be provided in the peripheral circuit region PCR of the substrate 10 to define peripheral active regions PACT. Peripheral logic circuits, which are used to write and read data in and from memory cells, may be provided on the peripheral circuit region PCR of the substrate 10. The peripheral logic circuits may include row and column decoders, a page buffer, and control circuits. The peripheral logic circuits may include, for example, a high- or low-voltage transistor, a resistor, and capacitor. In an embodiment, the high-voltage transistor may be provided on the first peripheral circuit region PCR1 of the substrate 10, and the low-voltage transistor may be provided on the second peripheral circuit region PCR2 of the substrate 10. The high-voltage transistor may be closer to the cell array region CAR than the low-voltage transistor.

A first peripheral gate stack PGS1 may be provided on the first peripheral circuit region PCR1, and a second peripheral gate stack PGS2 may be provided on the second peripheral circuit region PCR2. Each of the first and second peripheral gate stacks PGS1 and PGS2 may be provided to cross a corresponding one of the peripheral active regions PACT. Each of the first and second peripheral gate stacks PGS1 and PGS2 may include a gate conductive pattern PCP, a gate metal pattern PMP, and a peripheral hard mask pattern HMP, which are sequentially stacked on the substrate 10, as illustrated in FIG. 2B. In addition, each of the first and second peripheral gate stacks PGS1 and PGS2 may further include gate spacers PSP covering both side surfaces of the gate conductive pattern PCP, the gate metal pattern PMP, and the peripheral hard mask pattern HMP, as illustrated in FIG. 2B. A gate insulating layer 15 may be provided between the peripheral circuit region PCR of the substrate 10 and the first and second peripheral gate stacks PGS1 and PGS2, as illustrated in FIG. 2B. In addition, source/drain impurity regions may be provided in the peripheral active regions PACT and at both side of the first and second peripheral gate stacks PGS1 and PGS2. A peripheral circuit insulating layer 110 may be provided on the peripheral circuit region PCR to cover the top surface of the substrate 10, as illustrated in FIG. 2B. The peripheral circuit insulating layer 110 may be formed of or include at least one of silicon oxide or silicon oxynitride. The peripheral circuit insulating layer 110 may have a substantially flat top surface.

Electrode structures ST may be provided on the cell array region CAR, the dummy region DMY, and the connection region CNR of the substrate 10, as illustrated in FIGS. 2A-2C. The electrode structures ST may extend from the cell array region CAR to the connection region CNR or in the first direction D1. The electrode structures ST may be spaced apart from each other in the second direction D2. The electrode structures ST may include electrodes EL and ELt and interlayer insulating layers ILDa and ILDb, which are alternately stacked in the third direction D3 perpendicular to the top surface of the substrate 10, as illustrated in FIGS. 2B and 2C. Each of the electrode structures ST may have a substantially flat top surface on the cell array region CAR and the dummy region DMY. That is, in each of the electrode structures ST, a top surface ILDbt of the uppermost interlayer insulating layer ILDb may be parallel to the top surface of the substrate 10, as illustrated in FIG. 2C. The electrode structures ST may be provided to have a staircase structure on the connection region CNR, as illustrated in FIGS. 2B and 2C. The lengths of the electrodes EL and ELt of the electrode structures ST in the first direction D1 may decrease with increasing distance from the substrate 10, and the heights of the electrode structures ST may decrease with increasing distance from the cell array region CAR.

The electrodes EL and ELt may have side surfaces, which are uniformly spaced apart from each other in the first direction D1 by a specific distance, when viewed in a plan view. Among the electrodes EL and ELt, the uppermost electrode ELt may have the shortest length in the first direction D1 and the largest distance in the third direction D3 from the substrate 10, as illustrated in FIGS. 2B and 2C. In an embodiment, the electrodes EL and ELt may have substantially the same thickness in the third direction D3. The electrodes EL and ELt may be formed of or include at least one of, for example, doped semiconductor materials (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). Referring back to FIG. 1, the electrodes EL and ELt may be used as the ground selection lines GSL0-GSL2, the word lines WL0-WLn and DWL, the first string selection lines SSL1-1, SSL1-2, and SSL1-3, and the second string selection lines SSL2-1, SSL2-2, and SSL2-3.

The interlayer insulating layers ILDa and ILDb may extend from the cell array region CAR to the peripheral circuit region PCR and may cover the electrodes EL and ELt, respectively, as illustrated in FIG. 2B. The uppermost interlayer insulating layer ILDb may be provided on the uppermost electrode ELt. The uppermost interlayer insulating layer ILDb may be thicker than each of the interlayer insulating layers ILDa, when measured in the third direction D3. The interlayer insulating layers ILDa and ILDb may be formed of or include substantially the same insulating material or different insulating materials from each other. For example, the interlayer insulating layers ILDa and ILDb may be formed of or include a high density plasma (HDP) oxide or tetraethylorthosilicate (TEOS).

When viewed in a plan view, common source plugs CSP may be provided between the electrode structures ST, and each of the common source plugs CSP may be surrounded by an insulating spacer SP. Each of the common source plugs CSP may have a plate-shaped structure that extends in the first and third directions D1 and D3. The common source plugs CSP may be extended from the cell array region CAR to the connection region CNR in the first direction D1. The common source plugs CSP may be spaced apart from each other in the second direction D2. The common source plugs CSP may be connected to common source regions, which are formed in the substrate 10. The common source regions may serve as the common source line CSL of FIG. 1.

A source structure SC may be interposed between the electrode structures ST and the substrate 10. The source structure SC may extend parallel to the electrode structures ST and in the first direction D1. The source structure SC may include a first source conductive pattern SCP1 and a second source conductive pattern SCP2, which are sequentially stacked on the substrate 10. A thickness of the first source conductive pattern SCP1 in the third direction D3 may be greater than a thickness of the second source conductive pattern SCP2 in the third direction D3. The first source conductive pattern SCP1 may be in contact with the substrate 10, and the second source conductive pattern SCP2 may be in direct contact with the first source conductive pattern SCP1. The second source conductive pattern SCP2 may be provided between the first source conductive pattern SCP1 and the bottommost one of the interlayer insulating layers ILDa and ILDb of the electrode structures ST. The first source conductive pattern SCP1 and the second source conductive pattern SCP2 may be formed of or include a doped semiconductor material. In an embodiment, a doping concentration may be higher in the first source conductive pattern SCP1 than in the second source conductive pattern SCP2.

A planarization insulating layer 130 may be provided on the substrate 10 to cover the electrode structures ST and the peripheral circuit insulating layer 110. A top surface 130t (FIG. 2C) of the planarization insulating layer 130 may be substantially flat. The top surface 130t of the planarization insulating layer 130 may be substantially coplanar with the top surface ILDbt of the uppermost interlayer insulating layer ILDb. On the connection region CNR, a thickness of the planarization insulating layer 130 measured in the third direction D3 may increase in the first direction D1. The thickness of the planarization insulating layer 130 measured in the third direction D3 may have the largest value on the peripheral circuit region PCR. The planarization insulating layer 130 may be formed of or include an insulating material that is different from the interlayer insulating layers ILDa and ILDb. In an embodiment, the interlayer insulating layers ILDa and ILDb may be formed of or include a high density plasma oxide, and the planarization insulating layer 130 may be formed of or include TEOS.

Figure 4A:
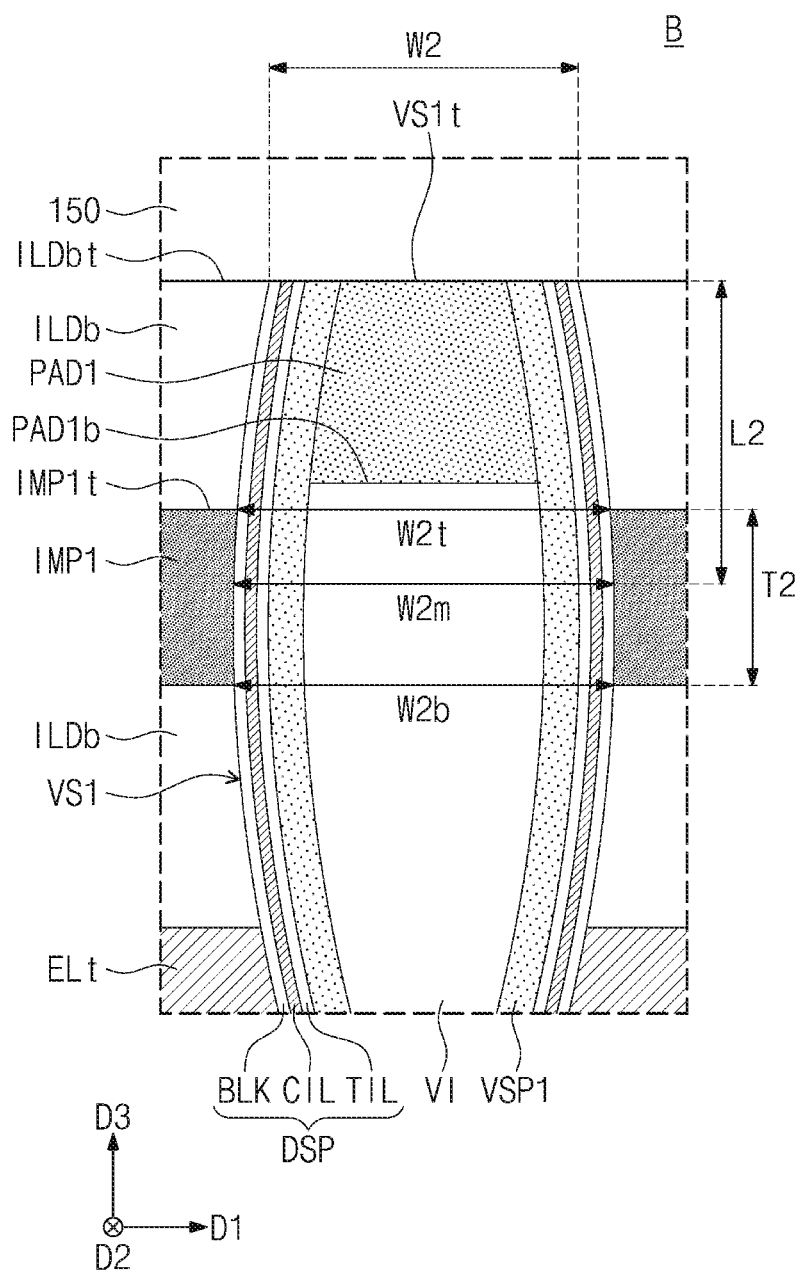
FIGS. 4A and 4B are enlarged sectional views illustrating a portion (e.g., B of FIG. 2B) of a three-dimensional semiconductor memory device according to an embodiment of the inventive concept.
Figure 4B:
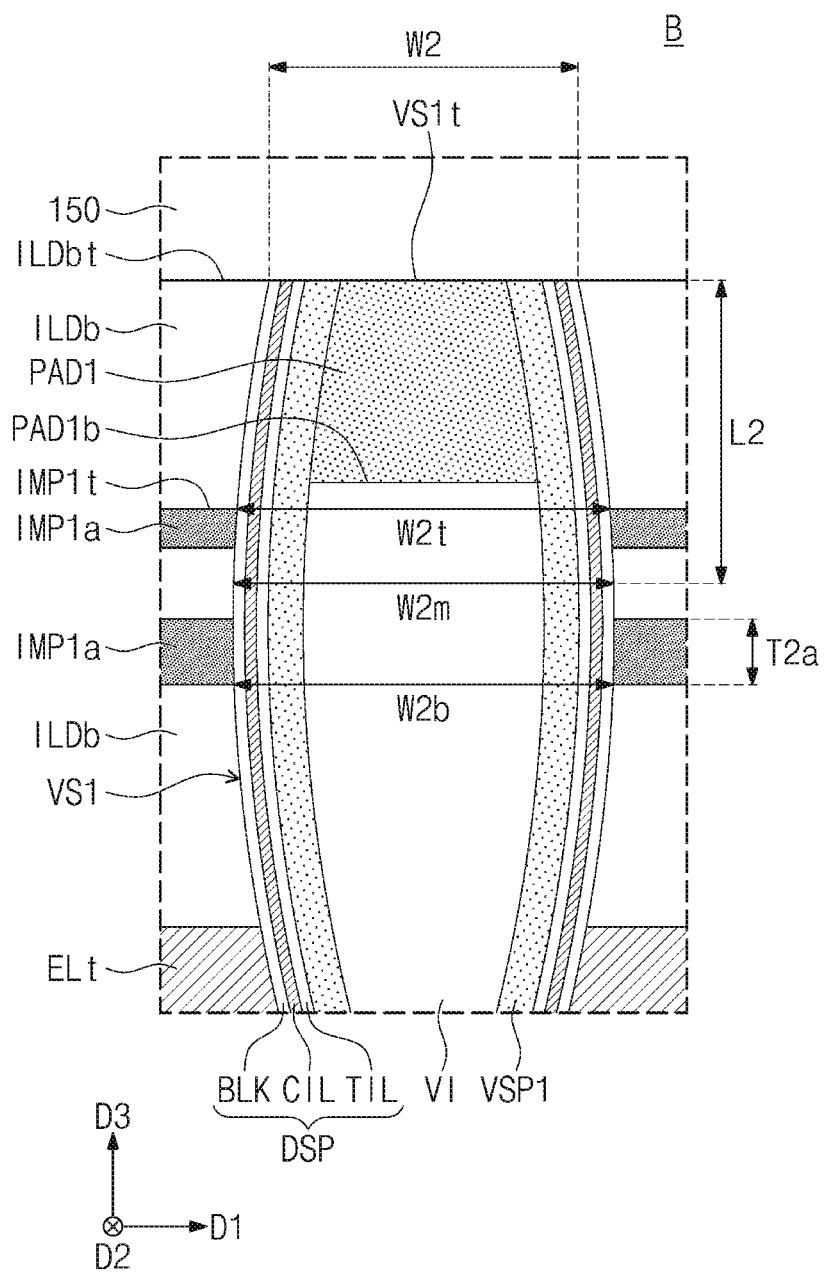

A first horizontal insulating layer IMP1 may be provided in the uppermost interlayer insulating layer ILDb and may extend along the electrodes EL and ELt in the first direction D1. The first horizontal insulating layer IMP1 may extend into the planarization insulating layer 130. Referring to FIGS. 4A and 4B, a top surface IMP1t of the first horizontal insulating layer IMP1 may be located at a level lower than the top surface ILDbt of the uppermost interlayer insulating layer ILDb. A bottom surface of the first horizontal insulating layer IMP1 may be located at a level higher than the top surface of the uppermost electrode ELt. In other words, the first horizontal insulating layer IMP1 may be provided between the top surface of the uppermost electrode ELt and the top surface ILDbt of the uppermost interlayer insulating layer ILDb. The first horizontal insulating layer IMP1 may be formed of or include a material whose etch-resistive property is better than that of the uppermost interlayer insulating layer ILDb and the planarization insulating layer 130 (i.e., the material of the first horizontal insulating layer IMP1 has a higher etch resistance than the material of the uppermost interlayer insulating layer ILDb and the planarization insulating layer 130). Here, the etch-resistive property may mean a resistive property to an etchant that is used for a wet or dry etching process. In an embodiment, the first horizontal insulating layer IMP1 may have a higher density than the uppermost interlayer insulating layer ILDb and the planarization insulating layer 130. In an embodiment, a concentration of a nonmetallic element, except for oxygen, may be higher in the first horizontal insulating layer IMP1 than in the uppermost interlayer insulating layer ILDb and the planarization insulating layer 130. In an embodiment, the concentration of the nonmetallic element may change continuously at a boundary between the first horizontal insulating layer IMP1 and the uppermost interlayer insulating layer ILDb and a boundary between the first horizontal insulating layer IMP1 and the planarization insulating layer 130. For example, the first horizontal insulating layer IMP1 may include at least one nonmetallic element, which is selected from nitrogen (N), carbon (C), boron (B), phosphorus (P), helium (He), and argon (Ar). An ion implantation process may be performed on the uppermost interlayer insulating layer ILDb and the planarization insulating layer 130 to form the first horizontal insulating layer IMP1. In an embodiment, a thermal treatment process may be further performed after the ion implantation process. In an embodiment, the thermal treatment process may be a rapid thermal anneal (RTP) process. If the ion implantation process is performed under the condition of a large ion injection amount, the first horizontal insulating layer IMP1 may have an improved etch-resistive property.

In an embodiment, a plurality of the first horizontal insulating layers IMP1 may be provided. Referring to FIG. 4B, at least two first horizontal insulating layers IMP1a may be provided between the top surface of the uppermost electrode ELt and the top surface ILDbt of the uppermost interlayer insulating layer ILDb. The first horizontal insulating layers IMP1a may be spaced apart from each other in the third direction D3. In an embodiment, the first horizontal insulating layers IMP1a may be formed of or include different materials from each other. The first horizontal insulating layers IMP1a may be formed by performing an ion implantation process on the uppermost interlayer insulating layer ILDb and the planarization insulating layer 130 at least two times. The ion implantation processes may be performed using ions of different elements. In addition, the ion implantation processes may be performed under process conditions which are different from each other in an ion injection energy or an ion injection amount. In an embodiment, a thermal treatment process may be further performed, after the ion implantation process. The positions of the first horizontal insulating layers IMPla may be changed by adjusting an ion injection energy in the ion implantation process and a heating method in the thermal treatment process.

A plurality of first vertical structures VS1 may be provided on the cell array region CAR and the dummy region DMY to penetrate the electrode structures ST, the source structure SC, and a portion of the substrate 10. The first vertical structures VS1 may penetrate the uppermost interlayer insulating layer ILDb and the first horizontal insulating layer IMP1, which is provided in the uppermost interlayer insulating layer ILDb. Referring back to FIG. 1, the first vertical structures VS1 may be used as channel regions of the erase control transistor ECT, the first and second string selection transistors SST1 and SST2, the ground selection transistor GST, and the memory cell transistors MCT.

Figure 5:
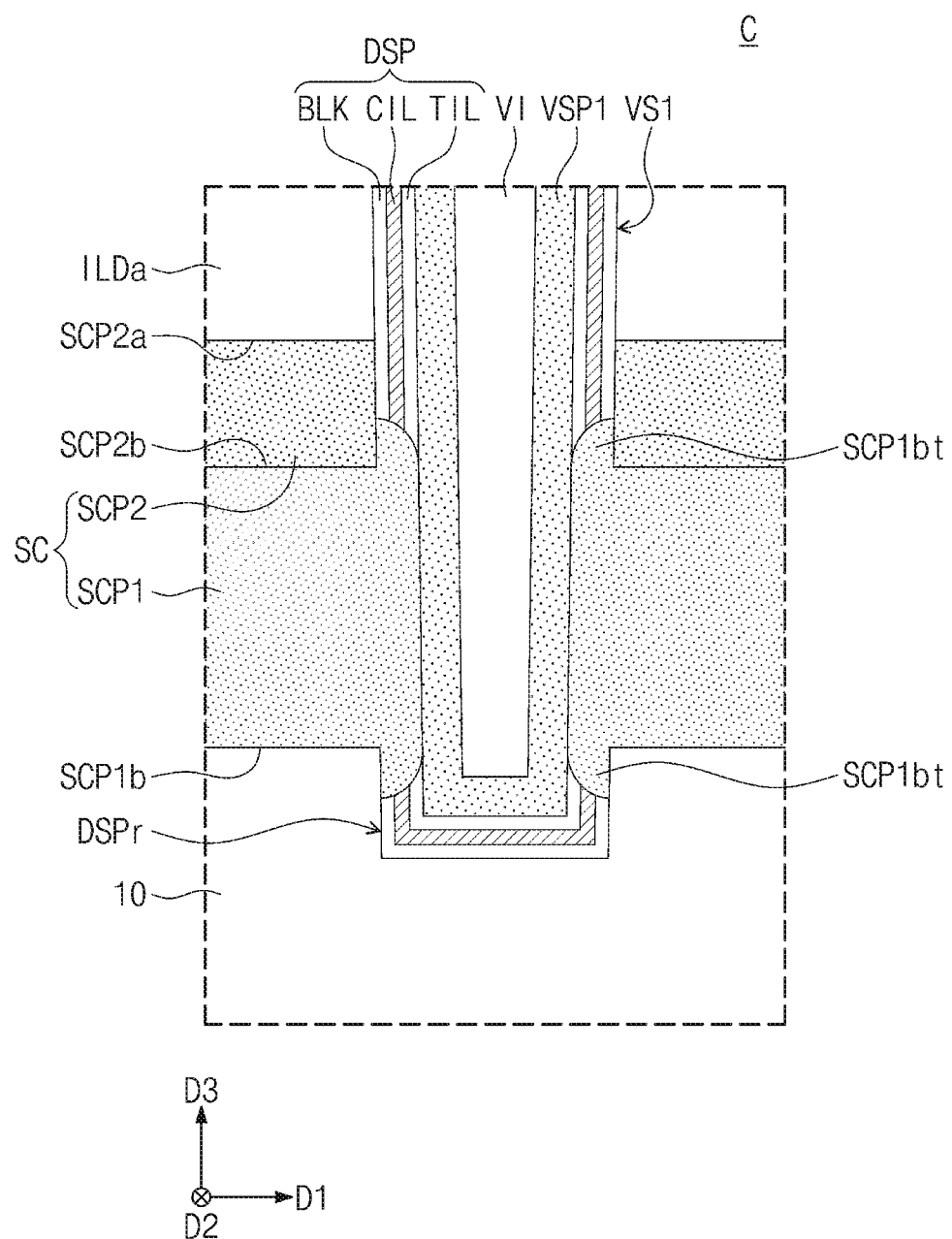
FIG. 5 is an enlarged sectional view illustrating a portion (e.g., C of FIG. 2B) of a three-dimensional semiconductor memory device according to an embodiment of the inventive concept.

Each of the first vertical structures VS1 may include a data storage pattern DSP, a first vertical semiconductor pattern VSP1, and a first conductive pad PAD1. Referring to FIGS. 4A, 4B, and 5, the data storage pattern DSP may include a blocking insulating layer BLK, a charge storing layer CIL, and a tunneling insulating layer TIL, which are sequentially stacked. Each of the first vertical structures VS1 may further include a buried insulating pattern VI, which is surrounded by the first vertical semiconductor pattern VSP1 and the first conductive pad PAD1. The top surface IMPlt of the first horizontal insulating layer IMP1 may be located at a level lower than a bottom surface PAD1b of the first conductive pad PAD1, as illustrated in FIG. 4A. However, in an embodiment, the top surface IMPlt of the first horizontal insulating layer IMP1 may be substantially coplanar with the bottom surface PAD1b of the first conductive pad PAD1, unlike that illustrated in FIG. 4A.

The first vertical semiconductor pattern VSP1 may be surrounded by the data storage pattern DSP. A portion of a side surface of the first vertical semiconductor pattern VSP1 may be in contact with the source structure SC. For example, the first vertical semiconductor pattern VSP1 may be in contact with the first source conductive pattern SCP1 of the source structure SC and may be spaced apart from the second source conductive pattern SCP2. Each of the first vertical structures VS1 may further include a lower data storage pattern DSPr. The lower data storage pattern DSPr may have a substantially 'U'-shaped section. The lower data storage pattern DSPr may be spaced apart from the data storage pattern DSP, and the first source conductive pattern SCP1 in contact with the first vertical semiconductor pattern VSP1 may be interposed between the lower data storage pattern DSPr and the data storage pattern DSP. The lower data storage pattern DSPr may be provided below the top surface of the substrate 10. The first conductive pad PAD1 may be connected to a top portion of the first vertical semiconductor pattern VSP1. A top surface of the first conductive pad PAD1 may be substantially coplanar with the top surface of the data storage pattern DSP and the top surface of the first vertical semiconductor pattern VSP1, as illustrated in FIG. 4A. The first conductive pad PAD1 may be formed of or include a doped semiconductor material or a conductive material.

The data storage pattern DSP and the first vertical semiconductor pattern VSP1 may be formed by etching the electrode structures ST, depositing an insulating material or a semiconductor material using a chemical vapor deposition (CVD) or atomic layer deposition (ALD) method, and performing a planarization process to expose the top surfaces of the electrode structures ST.

A plurality of second vertical structures VS2 may be provided on the connection region CNR to penetrate the planarization insulating layer 130, the electrode structures ST, the source structure SC, and a portion of the substrate 10. The second vertical structures VS2 may penetrate the staircase structure of the electrode structures ST, as illustrated in FIG. 2C. The second vertical structures VS2 may penetrate the first horizontal insulating layer IMP1, which is provided in the planarization insulating layer 130, as illustrated in FIG. 2C. Each of the second vertical structures VS2 may include the data storage pattern DSP, a second vertical semiconductor pattern VSP2, and a second conductive pad PAD2. Each of the second vertical structures VS2 may have substantially the same structure as the first vertical structures VS1 and may be formed by substantially the same method as that for the first vertical structures VS1.

The first and second vertical structures VS1 and VS2 may be arranged in a zigzag shape, when viewed in a plan view. In each of the first and second vertical structures VS1 and VS2, the data storage pattern DSP may have a hollow pipe shape or a macaroni shape. The first and second vertical semiconductor patterns VSP1 and VSP2 of the first and second vertical structures VS1 and VS2 may have a pipe or macaroni shape with closed bottom. The first and second vertical semiconductor patterns VSP1 and VSP2 may be formed of or include at least one of semiconductor materials (e.g., silicon (Si) and germanium (Ge)). In an embodiment, the first and second vertical semiconductor patterns VSP1 and VSP2 may be formed of or include a doped semiconductor material, an intrinsic semiconductor material, or a polycrystalline semiconductor material. For example, top surfaces of the first and second vertical structures VS1 and VS2 may have a circular, elliptical, or bar shape. In an embodiment, widths of the second vertical structures VS2 may be larger than widths of the first vertical structures VS1. In an embodiment, the first and second vertical structures VS1 and VS2 may have substantially the same length in the third direction D3. Bottom surfaces of the first and second vertical structures VS1 and VS2 may be located at a level lower than the top surface of the substrate 10. For example, the first and second vertical structures VS1 and VS2 may be connected to the substrate 10. At least one of the first and second vertical structures VS1 and VS2 may be a dummy vertical structure including the dummy data storage pattern DSPd.

An upper insulating layer 150 may be provided on the electrode structures ST and the planarization insulating layer 130, as illustrated in FIGS. 2B and 2C. The upper insulating layer 150 may cover the top surface ILDbt of the uppermost interlayer insulating layer ILDb and the top surface 130t of the planarization insulating layer 130. The upper insulating layer 150 may be provided to have substantially the same thickness in the third direction D3, on the cell array region CAR, the connection region CNR, and the peripheral circuit region PCR. In an embodiment, the upper insulating layer 150 may be formed of or include substantially the same insulating material as the planarization insulating layer 130. As an example, the upper insulating layer 150 may be formed of or include an insulating material different from the uppermost interlayer insulating layer ILDb.

Figure 3A:
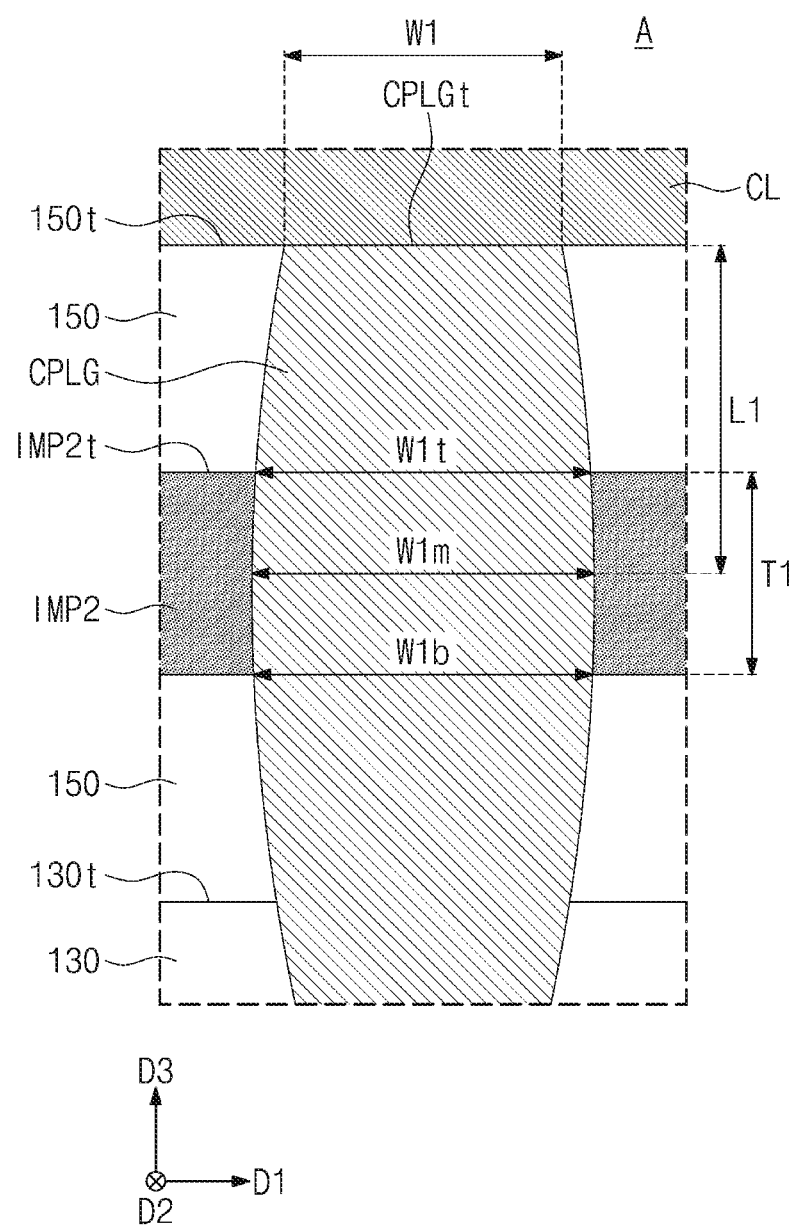
FIGS. 3A and 3B are enlarged sectional views illustrating a portion (e.g., A of FIG. 2B) of a three-dimensional semiconductor memory device according to an embodiment of the inventive concept.
Figure 3B:
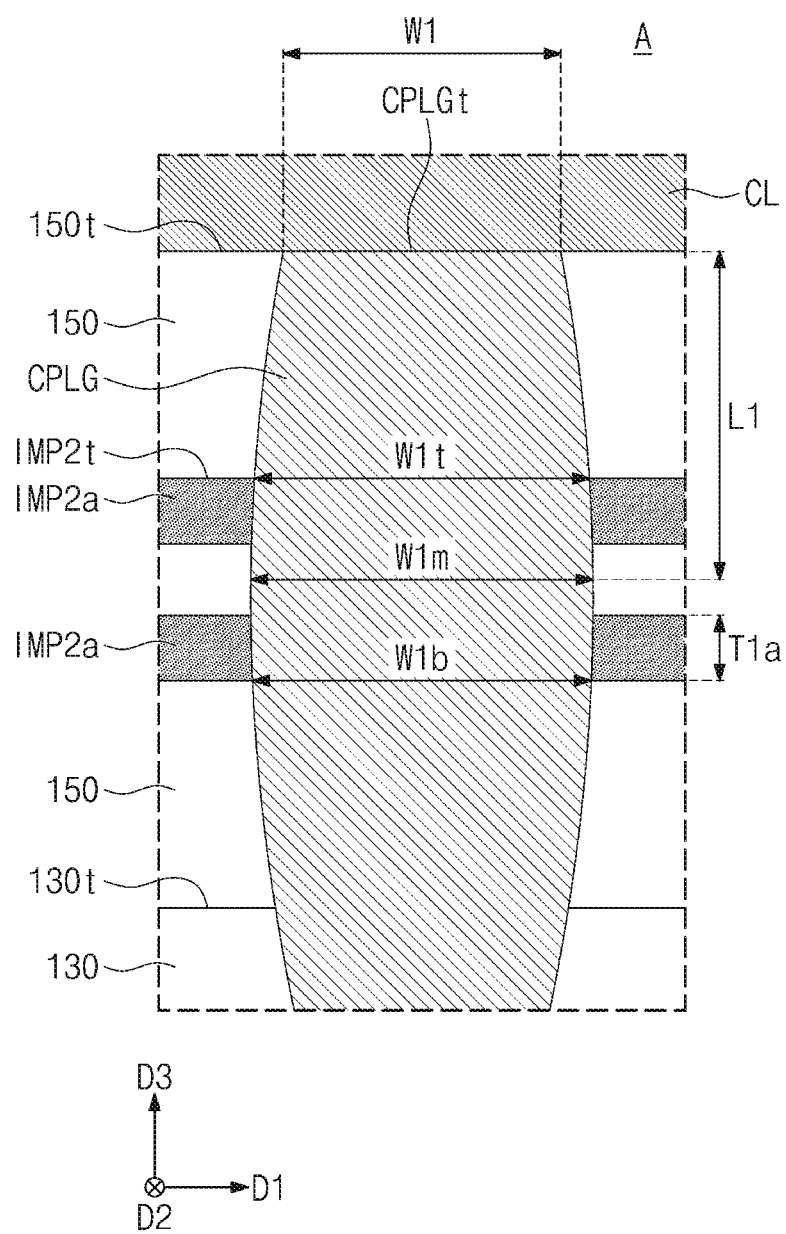

A second horizontal insulating layer IMP2 may be provided in the upper insulating layer 150 and may extend along the electrodes EL and ELt in the first direction D1. Referring to FIGS. 3A and 3B, a top surface IMP2t of the second horizontal insulating layer IMP2 may be located at a level lower than a top surface 150t of the upper insulating layer 150. A bottom surface of the second horizontal insulating layer IMP2 may be located at a level higher than the top surface 130t of the planarization insulating layer 130. In other words, the second horizontal insulating layer IMP2 may be provided between the top surface 130t of the planarization insulating layer 130 and the top surface 150t of the upper insulating layer 150. The second horizontal insulating layer IMP2 may be formed of or include a material whose etch-resistive property is better than that of the upper insulating layer 150. The etch-resistive property may mean a resistive property to an etchant that is used for a dry etching process. In an embodiment, the second horizontal insulating layer IMP2 may have a higher density than the upper insulating layer 150. In an embodiment, a concentration of a nonmetallic element, except for oxygen, may be higher in the second horizontal insulating layer IMP2 than in the upper insulating layer 150. In an embodiment, the concentration of the nonmetallic element may change continuously at a boundary between the second horizontal insulating layer IMP2 and the upper insulating layer 150. For example, the second horizontal insulating layer IMP2 may include at least one nonmetallic element, which is selected from nitrogen (N), carbon (C), boron (B), phosphorus (P), helium (He), and argon (Ar). In an embodiment, the second horizontal insulating layer IMP2 may have substantially the same chemical composition as the first horizontal insulating layer IMP1. In certain embodiments, the second horizontal insulating layer IMP2 may contain a nonmetallic element that is not contained in the first horizontal insulating layer IMP1. The second horizontal insulating layer IMP2 may be formed by performing an ion implantation process on the upper insulating layer 150. In an embodiment, a thermal treatment process may be further performed, after the ion implantation process. A method of forming the second horizontal insulating layer IMP2 may be substantially the same as that for the first horizontal insulating layer IMP1.

In an embodiment, a plurality of the second horizontal insulating layers IMP2 may be provided. Referring to FIG. 3B, at least two second horizontal insulating layers IMP2a may be provided between the top surface 130t of the planarization insulating layer 130 and the top surface 150t of the upper insulating layer 150. The second horizontal insulating layers IMP2a may be spaced apart from each other in the third direction D3. In an embodiment, the second horizontal insulating layers IMP2a may be formed of or include different materials from each other. The second horizontal insulating layers IMP2a may be formed by performing an ion implantation process on the upper insulating layer 150 at two times. The positions of the second horizontal insulating layers IMP2a may be changed by adjusting an ion injection energy in the ion implantation process and a heating method in the thermal treatment process. A method of forming the second horizontal insulating layers IMP2a may be substantially the same as the method of forming the first horizontal insulating layers IMP1a described with reference to FIG. 4B.

A plurality of bit lines BL may be provided on the cell array region CAR, may extend in the second direction D2, and may be spaced apart from each other in the first direction D1. Referring back to FIG. 1, the bit lines BL of FIGS. 2A to 2C may be used as the bit lines BL0-BL2 of FIG. 1. The bit lines BL may be provided on the upper insulating layer 150. The bit lines BL may be respectively connected to the first vertical structures VS1 through bit line contact plugs BPLG. The bit line contact plugs BPLG may be provided to penetrate the upper insulating layer 150 and the second horizontal insulating layer IMP2. The bit lines BL and the bit line contact plugs BPLG may be formed of or include at least one of conductive materials.

A plurality of conductive lines CL may be provided on the connection region CNR and the peripheral circuit region PCR, and in an embodiment, the conductive lines CL may extend in the second direction D2 and may be spaced apart from each other in the first direction D1. The conductive lines CL may be provided on the upper insulating layer 150. The conductive lines CL on the connection region CNR may be respectively connected to the electrodes EL of the electrode structures ST through cell contact plugs CPLG. The cell contact plugs CPLG may be provided to penetrate the upper insulating layer 150, the second horizontal insulating layer IMP2, the planarization insulating layer 130, the first horizontal insulating layer IMP1, and the interlayer insulating layers ILDa of the electrode structures ST. The conductive lines CL on the peripheral circuit region PCR may be respectively connected to the first and second peripheral gate stacks PGS1 and PGS2 through peripheral contact plugs PPLG. In detail, each of the peripheral contact plugs PPLG may be in contact with the gate metal pattern PMP. The peripheral contact plugs PPLG may be provided to penetrate the upper insulating layer 150, the second horizontal insulating layer IMP2, the planarization insulating layer 130, the first horizontal insulating layer IMP1, the peripheral circuit insulating layer 110, and the peripheral hard mask pattern HMP.

FIGS. 3A and 3B are enlarged sectional views illustrating a portion (e.g., A of FIG. 2B) of a three-dimensional semiconductor memory device according to an embodiment of the inventive concept.

One of the cell contact plugs CPLG will be described with reference to FIG. 3A, but the remaining ones of the cell contact plugs CPLG as well as the peripheral contact plugs PPLG on the peripheral circuit region PCR may also have substantially the same features as the cell contact plug CPLG to be described here. As described above, each of the cell contact plugs CPLG may be provided to penetrate the upper insulating layer 150, the second horizontal insulating layer IMP2, and the planarization insulating layer 130.

A width of the cell contact plug CPLG measured in the first direction D1 may increase from the top surface 150t of the upper insulating layer 150 to the top surface IMP2t of the second horizontal insulating layer IMP2 and may decrease from the bottom surface of the second horizontal insulating layer IMP2 to the substrate 10 (e.g., see FIG. 2B). In detail, the cell contact plug CPLG may have the largest width W1m that is larger than a width W1 of the cell contact plug CPLG at its top surface CPLGt. In addition, the largest width W1m of the cell contact plug CPLG may be larger than the widths W1t and W1b of the second horizontal insulating layer IMP2 at its top and bottom levels. The largest width W1m of the cell contact plug CPLG may range from about 2,000 Å to about 3,000 Å. In an embodiment, the cell contact plug CPLG may have the largest width W1m at an intermediate level of the second horizontal insulating layer IMP2. A first distance L1 from the top surface CPLGt of the cell contact plug CPLG to a portion with the largest width W1m may range from about 1,000 Å to about 4,000 Å.

Since the second horizontal insulating layer IMP2 is provided in the upper insulating layer 150, the largest width W1m of the cell contact plug CPLG may be reduced. The reduction of the largest width W1m of the cell contact plug CPLG may result from the fact that the etch-resistive property of the second horizontal insulating layer IMP2 is better than the etch-resistive property of the upper insulating layer 150. Due to the reduction of the largest width W1m of the cell contact plug CPLG, it may be possible to prevent a short circuit from being formed between adjacent ones of the cell contact plugs CPLG. Furthermore, by controlling process conditions (e.g., ion injection energy and ion injection amount) in the ion implantation process, it may be possible to control the largest width W1m of the cell contact plug CPLG and the first distance L1 from the top surface CPLGt of the cell contact plug CPLG to the portion with the largest width W1m.

The following Table 1 shows the largest width W1m of the cell contact plug CPLG, which were formed under different conditions for an ion injection energy and an ion injection amount.

TABLE 1

|  |  | Ion injection amount | |
| --- | --- | --- | --- |
| Ref: 2580 Å | | $5 \times 10^{15}/cm^2$ | $1 \times 10^{16}/cm^2$ |
| Ion injection energy | 35 keV | 2432 Å | 2426 Å |
| | 50 keV | 2469 Å | 2556 Å |

Referring to Table 1, in the case (Ref) where the second horizontal insulating layer IMP2 was not provided (i.e., the ion implantation process was not performed), the largest width W1m of the cell contact plug CPLG was about 2,580 Å. Also, in the case where the second horizontal insulating layer IMP2 was formed by the ion implantation process, the largest width W1m of the cell contact plug CPLG was reduced. Comparing with the case (Ref), in which the ion implantation process was not performed, the largest width W1m of the cell contact plug CPLG was reduced by about 5-6%. In this case, a short circuit was prevented from being formed between adjacent ones of the cell contact plugs CPLG. Referring to FIG. 3B, a plurality of the second horizontal insulating layers IMP2a may be provided in the upper insulating layer 150. In an embodiment, the second horizontal insulating layers IMP2a may have different thicknesses T1a, when measured in the third direction D3. In detail, the difference in thicknesses T1a between the second horizontal insulating layers IMP2a may be achieved by adjusting process conditions (e.g., ion injection energy and ion injection amount) in at least two ion implantation processes. Since the second horizontal insulating layers IMP2a are provided in the upper insulating layer 150, the largest width W1m of the cell contact plug CPLG may be smaller than that in FIG. 3A.

FIGS. 4A and 4B are enlarged sectional views illustrating a portion (e.g., B of FIG. 2B) of a three-dimensional semiconductor memory device according to an embodiment of the inventive concept.

One of the first vertical structures VS1 will be described with reference to FIG. 4A, but the remaining ones of the first vertical structures VS1 as well as the second vertical structures VS2 on the connection region CNR may also have substantially the same features as the first vertical structure VS1 to be described here. The first vertical structure VS1 may be provided to penetrate the uppermost interlayer insulating layer ILDb, the first horizontal insulating layer IMP1, and the uppermost electrode ELt, as described above.

A width of the first vertical structure VS1 measured in the first direction D1 may increase from the top surface ILDbt of the uppermost interlayer insulating layer ILDb to the top surface IMP1t of the first horizontal insulating layer IMP1 and may decrease from the bottom surface of the first horizontal insulating layer IMP1 to the substrate 10 (e.g., see FIG. 2B). In detail, the first vertical structure VS1 may have the largest width W2m that is larger than a width W2 of the first vertical structure VS1 at its top surface VS1t. In addition, the largest width W2m of the first vertical structure VS1 may be larger than widths W2t and W2b of the first horizontal insulating layer IMP1 at top and bottom levels of the first horizontal insulating layer IMP1. The largest width W2m of the first vertical structure VS1 may range from about 2,000 Å to about 3,000 Å. In an embodiment, the first vertical structure VS1 may have the largest width W2m at an intermediate level of the first horizontal insulating layer IMP1. A second distance L2 from the top surface VS1t of the first vertical structure VS1 to the portion with the largest width W2m may range from about 1,000 Å to about 4,000 Å.

Since the first horizontal insulating layer IMP1 is provided in the uppermost interlayer insulating layer ILDb, the largest width W2m of the first vertical structure VS1 may be reduced. The reduction of the largest width W2m of the first vertical structure VS1 may result from the fact that the etch-resistive property of the first horizontal insulating layer IMP1 is better than the etch-resistive property of the uppermost interlayer insulating layer ILDb. Due to the reduction of the largest width W2m of the first vertical structure VS1, it may be possible to prevent a short circuit from being formed between adjacent ones of the first vertical structures VS1. Furthermore, by controlling an ion injection energy and an ion injection amount in an ion implantation process, it may be possible to control the largest width W2m of the first vertical structure VS1 and the second distance L2 from the top surface VS It of the first vertical structure VS1 to a portion with the largest width W2m.

Referring to FIG. 4B, a plurality of the first horizontal insulating layers IMP1a may be provided in the uppermost interlayer insulating layer ILDb. When measured in the third direction D3, the first horizontal insulating layers IMP1a may have different thicknesses T2a. In detail, the difference in thicknesses T2a between the first horizontal insulating layers IMP1a may be achieved by adjusting process conditions (e.g., ion injection energy and ion injection amount) in at least two ion implantation processes. Since a plurality of the first horizontal insulating layers IMP1a are provided, the largest width W2m of the first vertical structure VS1 may be smaller than that in FIG. 4A.

FIG. 5 is an enlarged sectional view illustrating a portion (e.g., C of FIG. 2B) of a three-dimensional semiconductor memory device according to an embodiment of the inventive concept.

The source structure SC and one of the first vertical structures VS1 will be described with reference to FIG. 5, but the remaining ones of the first vertical structures VS1 may also have substantially the same features as those to be described here. As described above, the source structure SC may include the first and second source conductive patterns SCP1 and SCP2, and each of the first vertical structures VS1 may include the data storage pattern DSP, the first vertical semiconductor pattern VSP1, the buried insulating pattern VI, and the lower data storage pattern DSPr.

The first source conductive pattern SCP1 of the source structure SC may be in contact with the first vertical semiconductor pattern VSP1, and the second source conductive pattern SCP2 may be spaced apart from the first vertical semiconductor pattern VSP1 with the data storage pattern DSP interposed therebetween. The first source conductive pattern SCP1 may be spaced apart from the buried insulating pattern VI with the first vertical semiconductor pattern VSP1 interposed therebetween.

In detail, the first source conductive pattern SCP1 may include protruding portions SCP1bt which are located at a level higher than a bottom surface SCP2b of the second source conductive pattern SCP2 or at a level lower than a bottom surface SCP1b of the first source conductive pattern SCP1. However, the protruding portions SCP1bt may be located at a level lower than a top surface SCP2a of the second source conductive pattern SCP2. Surfaces of the protruding portions SCP1bt, which is for example in contact with the data storage pattern DSP or the lower data storage pattern DSPr, may have a curved shape.

Figure 6A:
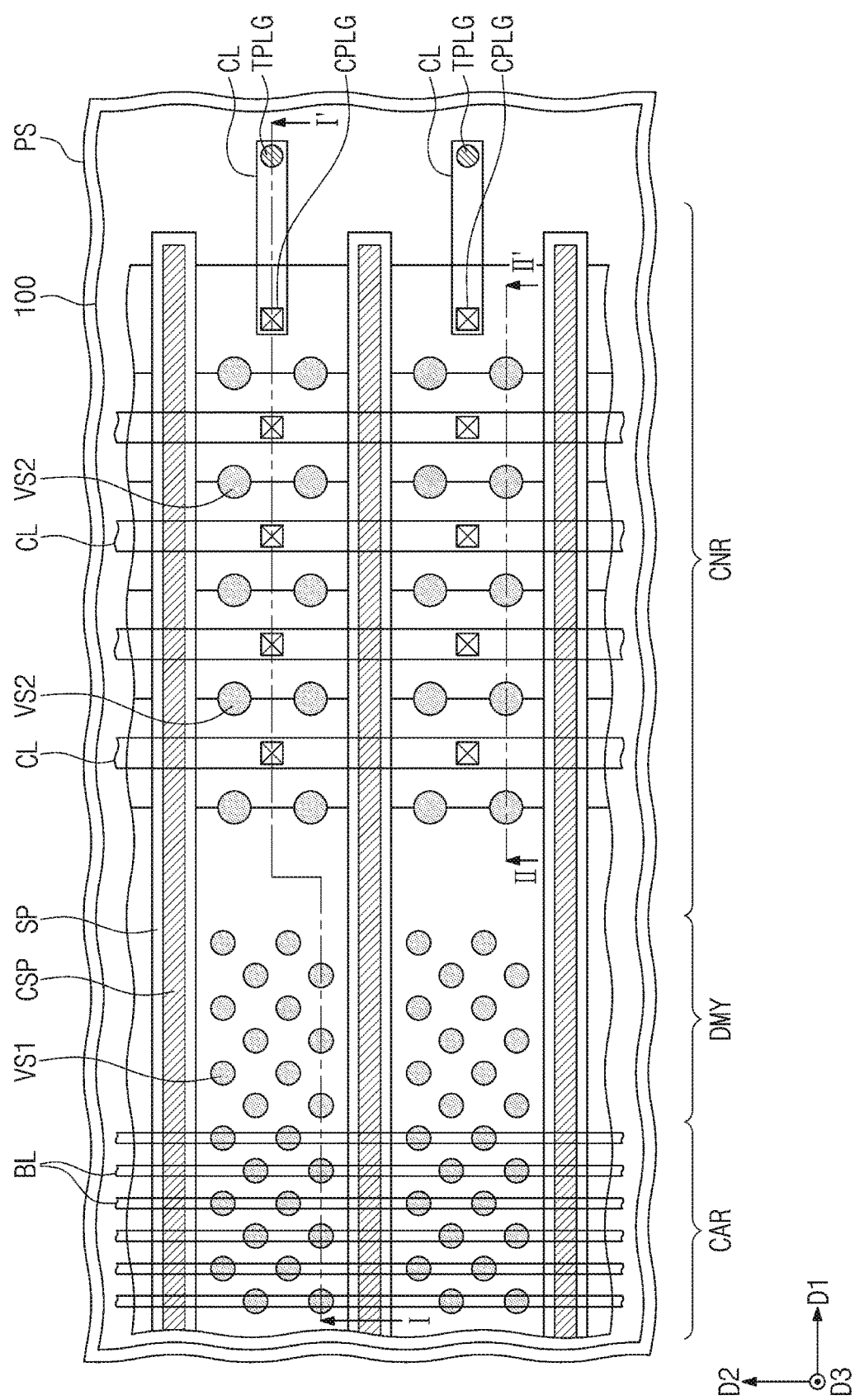
FIG. 6A is a plan view illustrating a three-dimensional semiconductor memory device according to an embodiment of the inventive concept.
Figure 6B:
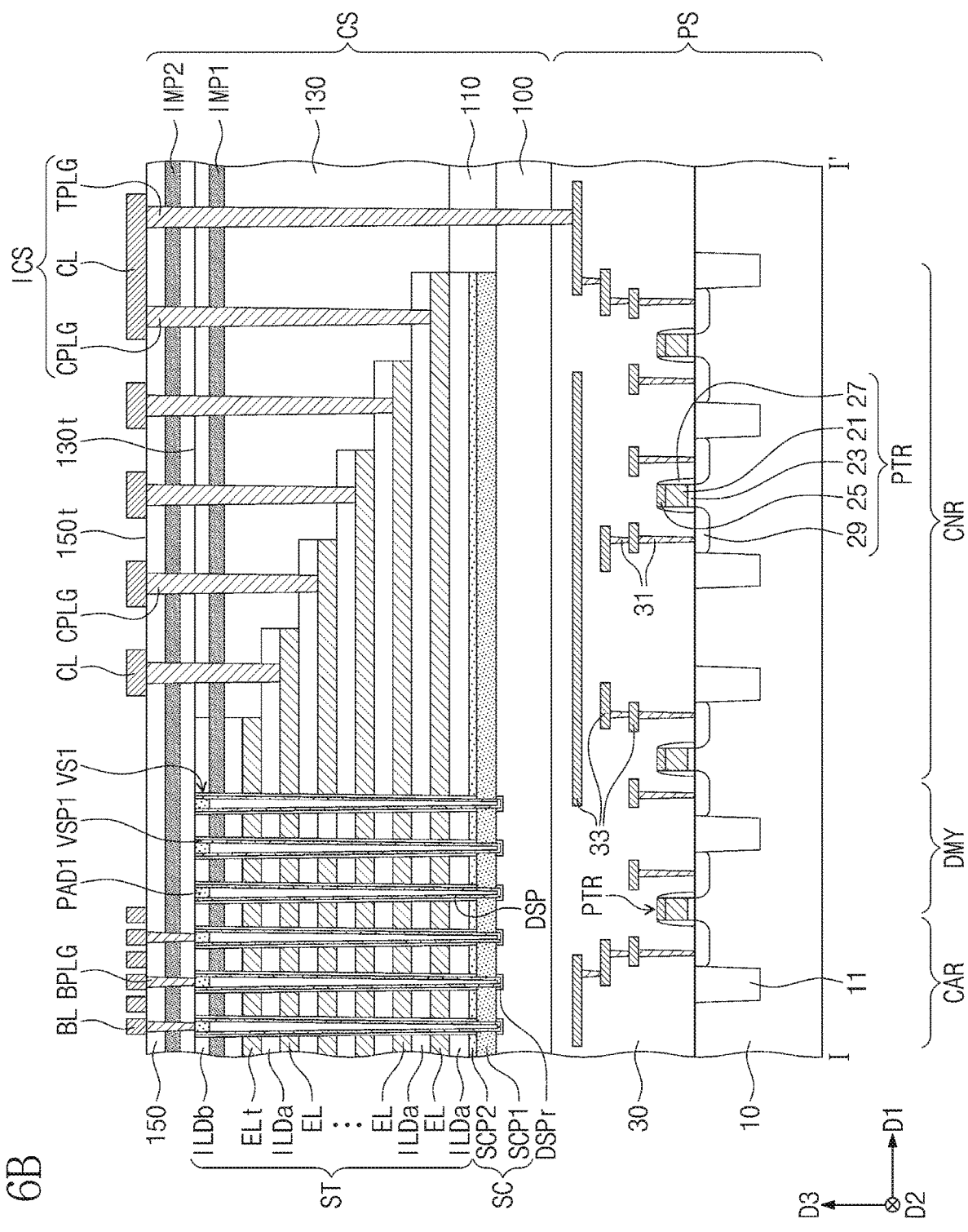
FIGS. 6B and 6C are sectional views illustrating a three-dimensional semiconductor memory device according to an embodiment of the inventive concept, taken along lines I-I' and II-IT of FIG. 6A.
Figure 6C:
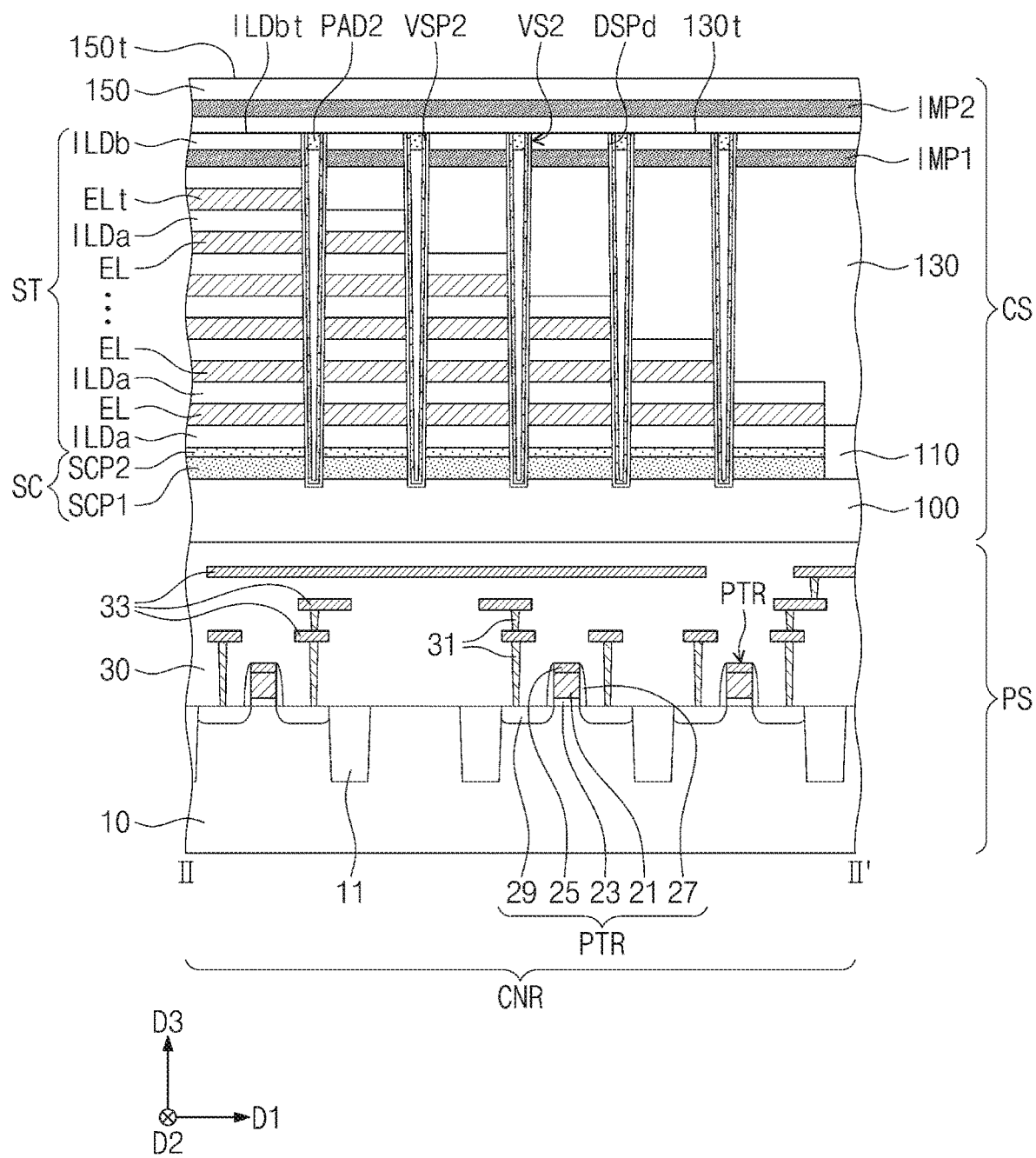

FIG. 6A is a plan view illustrating a three-dimensional semiconductor memory device according to an embodiment of the inventive concept. FIGS. 6B and 6C are sectional views illustrating a three-dimensional semiconductor memory device according to an embodiment of the inventive concept, taken along lines I-I' and II-IT of FIG. 6A. For concise description, an element previously described with reference to FIGS. 2A to 5 may be identified by the same reference number without repeating an overlapping description thereof.

Referring to FIGS. 6A, 6B, and 6C, the three-dimensional semiconductor memory device may include a peripheral circuit structure PS and a cell array structure CS on the peripheral circuit structure PS.

The peripheral circuit structure PS may include a first substrate 10, peripheral circuits PTR integrated on a top surface of the first substrate 10, and a peripheral insulating layer 30 covering the peripheral circuits PTR. The first substrate 10 may be a silicon substrate, a silicon-germanium substrate, a germanium substrate, or a single-crystalline epitaxial layer grown on a single-crystalline silicon substrate. The first substrate 10 may have active regions that are defined by device isolation layers 11.

The peripheral circuits PTR may include, for example, row and column decoders, a page buffer, a control circuit, and so forth. In detail, each of the peripheral circuits PTR may include a peripheral gate electrode 21, a peripheral gate insulating layer 23, a peripheral capping pattern 25, a peripheral gate spacer 27, and peripheral source/drain regions 29. The peripheral gate insulating layer 23 may be provided between the peripheral gate electrode 21 and the first substrate 10. The peripheral capping pattern 25 may be provided on the peripheral gate electrode 21. The peripheral gate spacer 27 may cover side surfaces of the peripheral gate electrode 21, the peripheral gate insulating layer 23, and the peripheral capping pattern 25. The peripheral source/drain regions 29 may be provided in portions of the substrate 10 located at both sides of the peripheral gate electrode 21. Peripheral circuit lines 33 may be electrically connected to the peripheral circuits PTR through peripheral contact plugs 31. As an example, the peripheral contact plugs 31 and the peripheral circuit lines 33 may be connected to transistors on the first substrate 10. For example, the transistors on the first substrate 10 may include NMOS, PMOS, or gate-all-around transistors. The peripheral insulating layer 30 may be provided on the top surface of the first substrate 10. In an embodiment, the peripheral insulating layer 30 may be provided on the first substrate 10 to cover the peripheral circuits PTR, the peripheral contact plugs 31, and the peripheral circuit lines 33. The peripheral insulating layer 30 may include a plurality of insulating layers stacked on the substrate 10. For example, the peripheral insulating layer 30 may be formed of or include at least one of silicon oxide, silicon nitride, silicon oxynitride, or low-k dielectric materials.

The cell array structure CS may be provided on the peripheral insulating layer 30, and in an embodiment, the cell array structure CS may include a second substrate 100, the electrode structures ST on the second substrate 100, the planarization insulating layer 130 provided on the second substrate 100 to cover the electrode structures ST, and the upper insulating layer 150 covering the electrode structures ST and the planarization insulating layer 130. The cell array structure CS may further include the first horizontal insulating layer IMP1, which is provided in the uppermost interlayer insulating layer ILDb of the electrode structures ST and is extended along the electrodes EL and ELt, and the second horizontal insulating layer IMP2, which is provided in the upper insulating layer 150 and is extended along the electrodes EL and ELt.

A connection structure ICS may be provided to connect the cell array structure CS to the peripheral circuit structure PS. The connection structure ICS may include one of the conductive lines CL on the upper insulating layer 150, the cell contact plug CPLG, and a penetration plug TPLG. The penetration plug TPLG may be provided to penetrate the upper insulating layer 150, the planarization insulating layer 130, the first and second horizontal insulating layers IMP1 and IMP2, the second substrate 100, and a portion of the peripheral insulating layer 30. The penetration plug TPLG may be connected to at least one of the peripheral circuit lines 33. Although not illustrated, a plurality of the penetration plugs TPLG may be provided and may be connected to the peripheral circuit lines 33, respectively.

Figure 7:
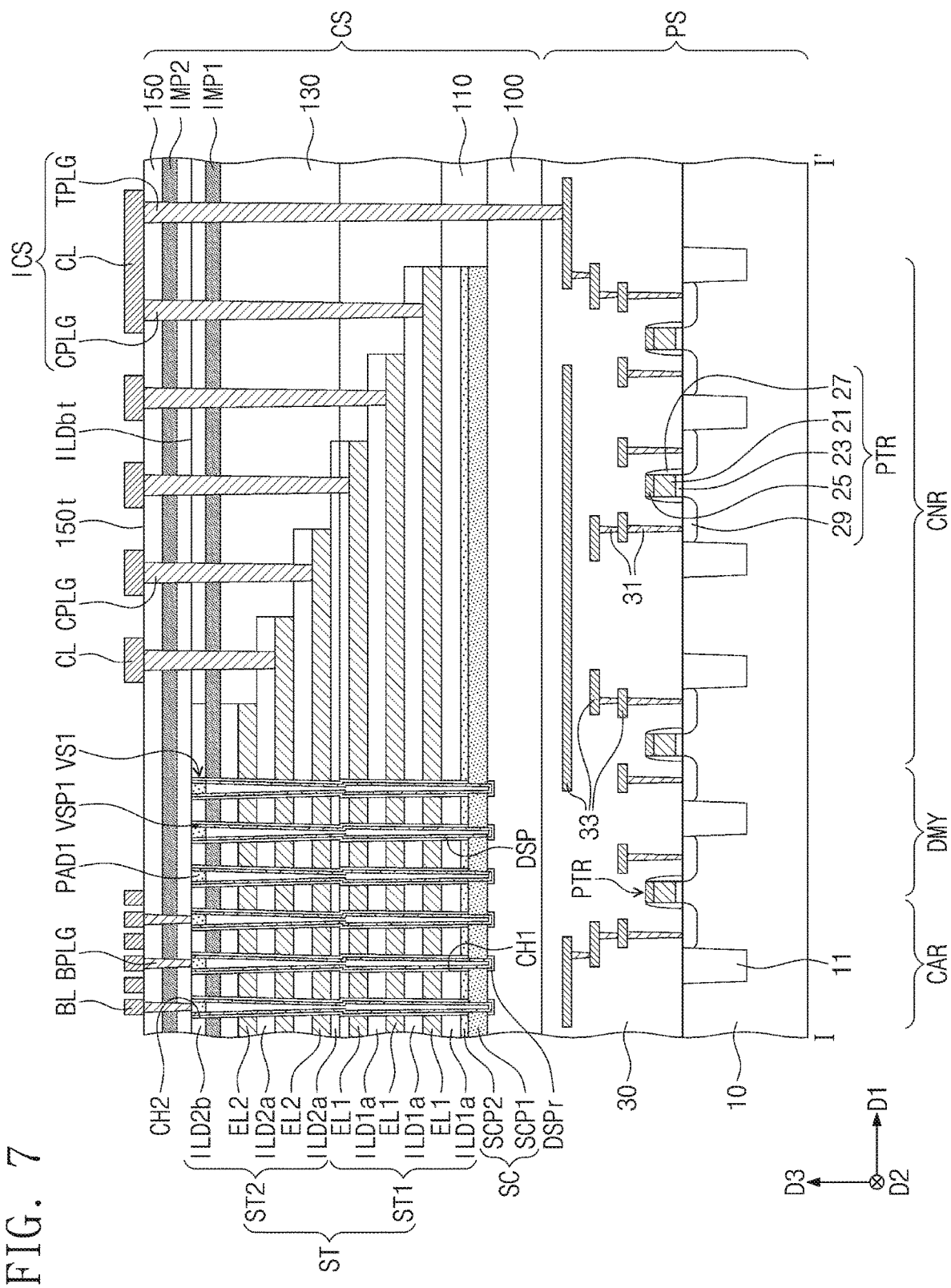
FIG. 7 is a sectional view illustrating a three-dimensional semiconductor memory device according to an embodiment of the inventive concept, taken along a line I-I' of FIG. 6A.

FIG. 7 is a sectional view illustrating a three-dimensional semiconductor memory device according to an embodiment of the inventive concept, taken along a line I-F of FIG. 6A. For concise description, an element previously described with reference to FIGS. 2A to 6C may be identified by the same reference number without repeating an overlapping description thereof.

Referring to FIG. 7, each of the electrode structures ST may include a first electrode structure ST1 and a second electrode structure ST2. The first electrode structure ST1 may include first electrodes EL1, which are sequentially stacked on the substrate 10, and first interlayer insulating layers ILD1a, which are provided between the first electrodes ELL The second electrode structure ST2 may include second electrodes EL2, which are sequentially stacked on the substrate 10, and second interlayer insulating layers ILD2a and ILD2b, which are provided between the second electrodes EL2. The first electrode structure ST1 may be provided on the source structure SC, and the second electrode structure ST2 may be provided on the first electrode structure ST1. In detail, the second electrode structure ST2 may be provided on a top surface of the topmost one of the first interlayer insulating layers ILD1a of the first electrode structure ST1. Accordingly, the lowermost one of the second interlayer insulating layers ILD2a and ILD2b of the second electrode structure ST2 may be in contact with the topmost one of the first interlayer insulating layers ILD1a of the first electrode structure ST1.

A first vertical channel CH1 may be provided to penetrate the first electrode structure ST1 and to expose a portion of the second substrate 100. A second vertical channel CH2 may be provided to penetrate the second electrode structure ST2 and to expose the first vertical channel CH1. The first vertical channel CH1 and the second vertical channel CH2 may be connected to each other. A lower diameter of the second vertical channel CH2 may be smaller than an upper diameter of the first vertical channel CH1. The first vertical structures VS1 may be provided in the first and second vertical channels CH1 and CH2. Each of the first vertical structures VS1 may include the data storage pattern DSP, the first vertical semiconductor pattern VSP1, and the first conductive pad PAD1. The data storage pattern DSP may be provided to conformally cover side surfaces of the first and second vertical channels CH1 and CH2.

Figure 8A:
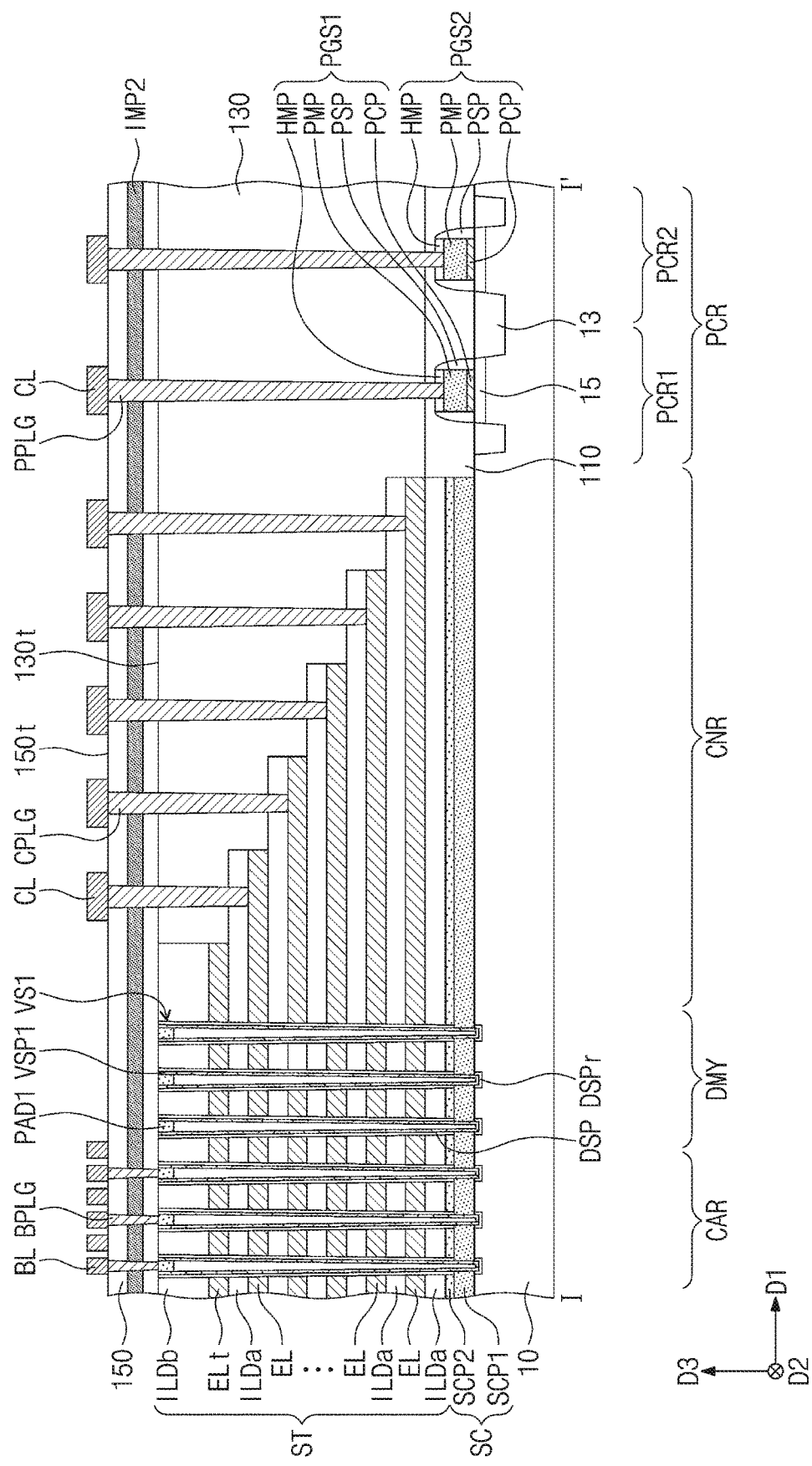
Figure 8B:
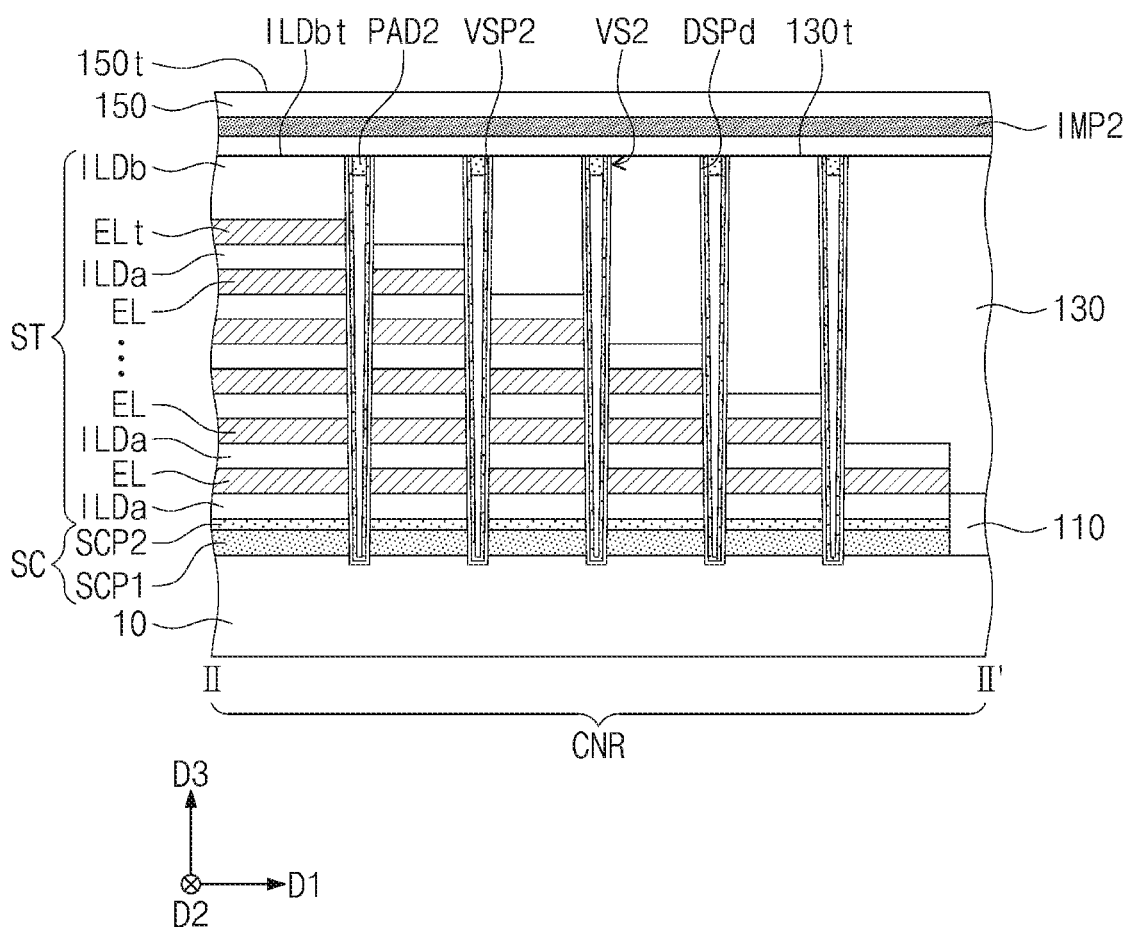
Figure 9A:
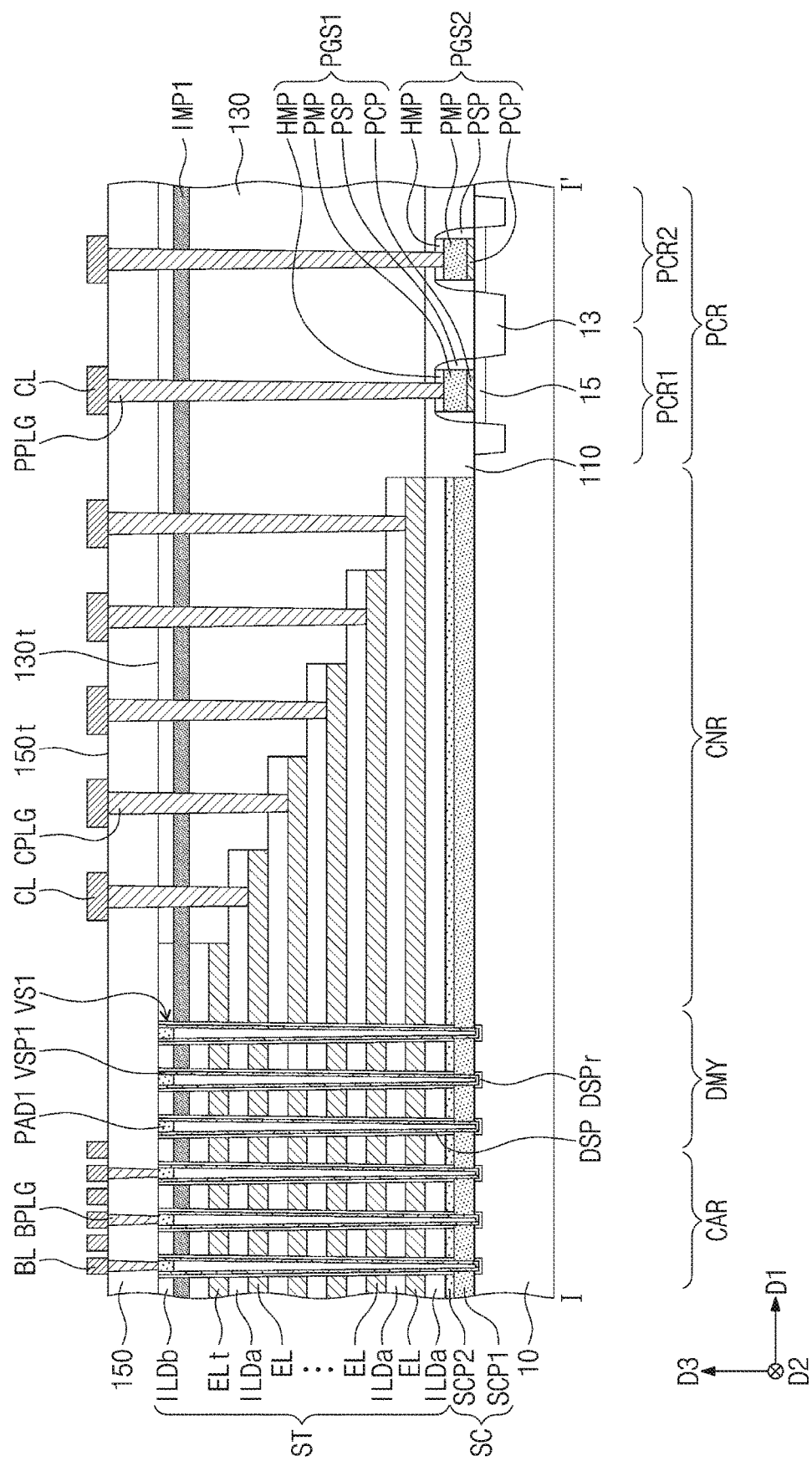
Figure 9B:
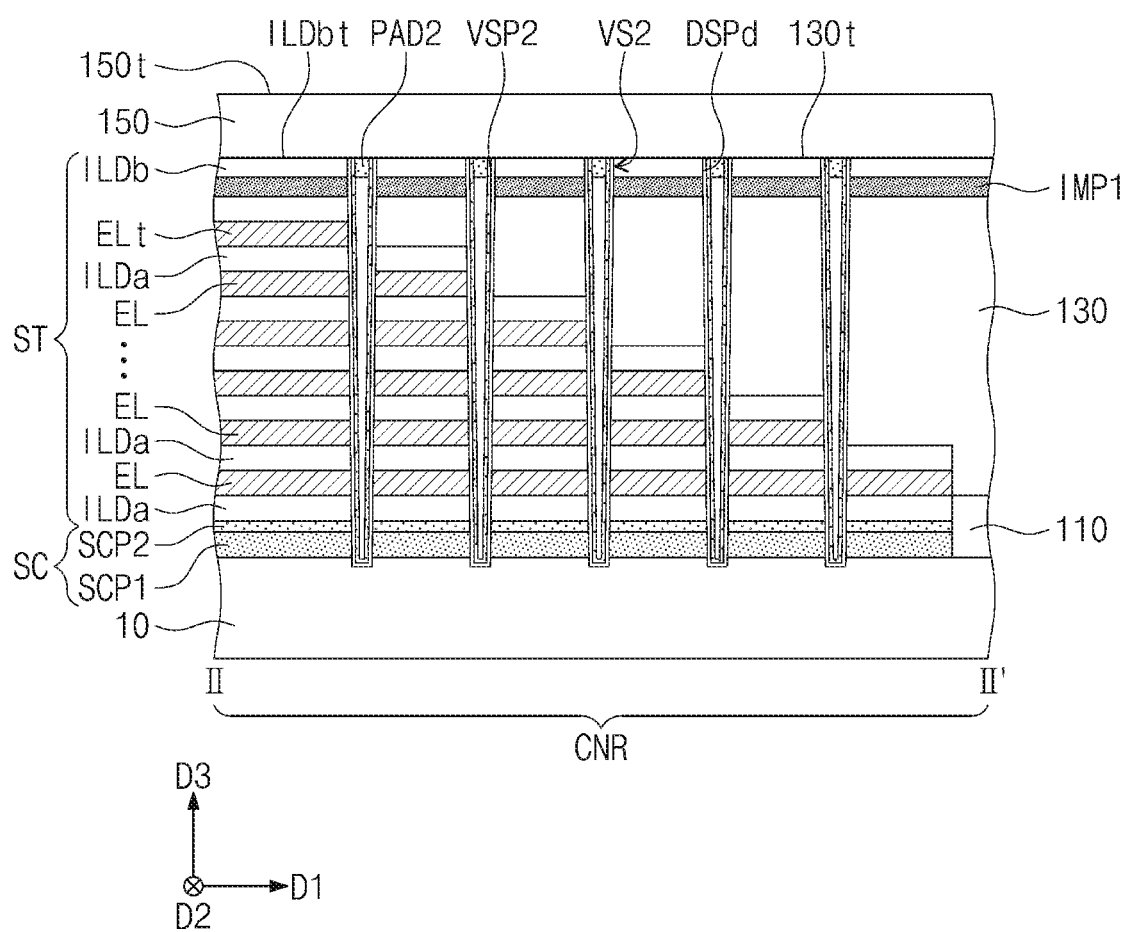

FIGS. 8A and 9A are sectional views illustrating a three-dimensional semiconductor memory device according to an embodiment of the inventive concept, taken along a line I-I' of FIG. 2A. FIGS. 8B and 9B are sectional views illustrating a three-dimensional semiconductor memory device according to an embodiment of the inventive concept, taken along a line II-II' of FIG. 2A. For concise description, an element previously described with reference to FIGS. 2A to 5 may be identified by the same reference number without repeating an overlapping description thereof.

Referring to FIGS. 8A and 8B, a three-dimensional semiconductor memory device may include the upper insulating layer 150, which includes the second horizontal insulating layer IMP2, without the first horizontal insulating layer IMP1. Referring to FIGS. 9A and 9B, a three-dimensional semiconductor memory device may include the uppermost interlayer insulating layer ILDb including the first horizontal insulating layer IMP1, without the second horizontal insulating layer IMP2. The first horizontal insulating layer IMP1 may be extended from the uppermost interlayer insulating layer ILDb into the planarization insulating layer 130. In other words, one of the first and second horizontal insulating layers IMP1 and IMP2 of FIGS. 2B and 2C may be omitted and the other may be provided.

According to an embodiment of the inventive concept, a three-dimensional semiconductor memory device may include an insulating layer that is formed to have a portion with an improved etch-resistive property through an ion implantation process, and this make it possible to reduce the largest width of a contact with a high aspect ratio. Accordingly, it may be possible to prevent a short circuit from being formed between the contacts and to improve electric characteristics of the three-dimensional semiconductor memory device.

While example embodiments of the inventive concepts have been particularly shown and described, it will be understood by one of ordinary skill in the art that variations in form and detail may be made therein without departing from the scope of the attached claims.

What is claimed is:

1. A three-dimensional semiconductor memory device, comprising:
a substrate including a cell array region and a connection region at an end portion of the cell array region;
an electrode structure extending from the cell array region to the connection region, the electrode structure comprising electrodes sequentially stacked on the substrate;
interlayer insulating layers between the electrodes;
an upper insulating layer on the electrode structure;
a first horizontal insulating layer in the upper insulating layer and extending along the electrodes;
a second horizontal insulating layer in an uppermost one of the interlayer insulating layers that extends along the electrodes,
wherein the second horizontal insulating layer is between an uppermost one of the electrodes and the first horizontal insulating layer;
first contact plugs in the connection region that penetrate the upper insulating layer and the first horizontal insulating layer,
wherein the first horizontal insulating layer comprises a material having a higher density and a higher etch resistance than the upper insulating layer; and
vertical structures penetrating the electrode structure and the second horizontal insulating layer, wherein each of the vertical structures has a width that increases from a top surface of the uppermost one of the interlayer insulating layers to the second horizontal insulating layer and decreases from the second horizontal insulating layer to the substrate in order to prevent a short circuit between adjacent vertical structures.

2. The device of claim 1, wherein the first horizontal insulating layer comprises a plurality of first horizontal insulating layers, which are provided in the upper insulating layer and are vertically spaced apart from each other with a portion of the upper insulating layer interposed therebetween.

3. The device of claim 1, wherein the second horizontal insulating layer extends from the uppermost one of the interlayer insulating layers toward the connection region, and
the first contact plugs penetrate the second horizontal insulating layer.

4. The device of claim 1, wherein each of the vertical structures comprises a data storage pattern, a vertical semiconductor pattern surrounded by the data storage pattern, and a conductive pad connected to a top portion of the vertical semiconductor pattern, and
a top surface of the second horizontal insulating layer is located at a level that is lower than or equal to a bottom surface of the conductive pad.

5. The device of claim 1, wherein the substrate further comprises a peripheral circuit region comprising peripheral circuits thereon,
the device further comprises second contact plugs in the peripheral circuit region that penetrate the upper insulating layer and the first horizontal insulating layer, and
wherein the second contact plugs are connected to the peripheral circuits.

6. The device of claim 5, wherein each of the first and second contact plugs has a width that increases from a top surface of the upper insulating layer to the first horizontal insulating layer and that decreases from the first horizontal insulating layer to the substrate.

7. The device of claim 1, wherein a distance from a top surface of the upper insulating layer to the first horizontal insulating layer is between 1,000 Å and 4,000 Å.

8. The device of claim 1, wherein the first horizontal insulating layer comprises a material containing at least one of nitrogen (N), carbon (C), boron (B), phosphorus (P), helium (He), or argon (Ar).

9. The device of claim 1, further comprising:
a peripheral circuit structure below the substrate, the peripheral circuit structure comprising peripheral circuits and peripheral lines connected to the peripheral circuits; and
at least one third contact plug adjacent to the connection region that penetrates the upper insulating layer, the first horizontal insulating layer, and a portion of the substrate,
wherein one of the peripheral lines is connected to the at least one third contact plug.

10. A three-dimensional semiconductor memory device, comprising:
a substrate including a cell array region and a connection region at an end portion of the cell array region;

an electrode structure extending from the cell array region to the connection region, the electrode structure comprising electrodes sequentially stacked on the substrate, and interlayer insulating layers between the electrodes;
an upper insulating layer on the electrode structure;
a first horizontal insulating layer in an uppermost one of the interlayer insulating layers that extends along the electrodes;
a second horizontal insulating layer in the upper insulating layer that extends along the electrodes;
a vertical structure penetrating the electrode structure and the first horizontal insulating layer; and
first contact plugs penetrating the upper insulating layer and the first and second horizontal insulating layers,
wherein the first horizontal insulating layer and the second horizontal insulating layer are vertically spaced apart from each other,
wherein a top surface of the first horizontal insulating layer is at a lower level than a top surface of the vertical structure,
wherein a concentration of a nonmetallic element, except for oxygen, is higher in the second horizontal insulating layer than in the upper insulating layer, and
wherein the second horizontal insulating layer comprises a material having a higher density and a higher etch resistance than the upper insulating layer.

11. The device of claim 10, wherein the nonmetallic element is one selected from nitrogen (N), carbon (C), boron (B), phosphorus (P), helium (He), and argon (Ar).

12. The device of claim 10, wherein each of a first distance from a top surface of the uppermost one of the interlayer insulating layers to a top surface of the first horizontal insulating layer and a second distance from a top surface of the upper insulating layer to a top surface of the second horizontal insulating layer is between 1,000 Å and 4,000 Å.

13. The device of claim 10, wherein the substrate further comprises a peripheral circuit region comprising peripheral circuits thereon,
the device further comprises second contact plugs in the peripheral circuit region that penetrate the upper insulating layer and the first and second horizontal insulating layers, and wherein the second contact plugs are connected to the peripheral circuits.

14. The device of claim 10, wherein a concentration of the nonmetallic element, except for oxygen, is higher in the first horizontal insulating layer than in the uppermost one of the interlayer insulating layers.

15. The device of claim 10, further comprising:
a peripheral circuit structure below the substrate, the peripheral circuit structure comprising peripheral circuits and peripheral lines connected to the peripheral circuits; and
at least one third contact plug adjacent to the connection region that penetrates the upper insulating layer, the first and second horizontal insulating layers, and a portion of the substrate,
wherein one of the peripheral lines is connected to the at least one third contact plug.

16. A three-dimensional semiconductor memory device, comprising:
a substrate including a cell array region, a peripheral circuit region including peripheral circuits, and a connection region between the cell array region and the peripheral circuit region;
an electrode structure extending from the cell array region to the connection region, the electrode structure comprising electrodes vertically stacked on the substrate, and interlayer insulating layers interposed between the electrodes;
an upper insulating layer on the electrode structure;
first and second horizontal insulating layers in the upper insulating layer that extends along the electrodes;
a vertical structure penetrating the electrode structure, the vertical structure comprising a data storage pattern, a vertical semiconductor pattern surrounded by the data storage pattern, and a conductive pad connected to a top portion of the vertical semiconductor pattern;
a bit line on the upper insulating layer and electrically connected to the conductive pad of the vertical structure;
a plurality of first contact plugs, wherein each first contact plug is on the connection region and penetrates the upper insulating layer, the first and second horizontal insulating layers, and one of the interlayer insulating layers, and is connected to a corresponding one of the electrodes;
a plurality of second contact plugs on the peripheral circuit region that penetrate the upper insulating layer and the first and second horizontal insulating layers, and that are connected to the peripheral circuits; and
conductive lines connected to the first and second contact plugs, respectively,
wherein each of the first contact plugs has a maximum width in the second horizontal insulating layer,
wherein a concentration of a nonmetallic element, except for oxygen, is higher in the horizontal insulating layer than in the upper insulating layer, and
wherein the horizontal insulating layer comprises a material having a higher density and a higher etch resistance than the upper insulating layer.

17. The device of claim 16, wherein the first and second horizontal insulating layers are provided in the upper insulating layer and are vertically spaced apart from each other with a portion of the upper insulating layer interposed therebetween.

18. The device of claim 16, wherein a distance from a top surface of the upper insulating layer to the horizontal insulating layer is between 1,000 Å and 4,000 Å.

19. The device of claim 16, wherein the horizontal insulating layer comprises a material containing at least one of nitrogen (N), carbon (C), boron (B), phosphorus (P), helium (He), or argon (Ar).

* * * * *